United States Patent
Yang et al.

(10) Patent No.: US 8,271,863 B2
(45) Date of Patent: Sep. 18, 2012

(54) FORWARD DECISION AIDED NONLINEAR VITERBI DETECTOR

(75) Inventors: Shaohua Yang, San Jose, CA (US); Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 1193 days.

(21) Appl. No.: 11/871,770

(22) Filed: Oct. 12, 2007

(65) Prior Publication Data

US 2008/0098288 A1 Apr. 24, 2008

Related U.S. Application Data

(60) Provisional application No. 60/829,949, filed on Oct. 18, 2006.

(51) Int. Cl.
*H03M 13/00* (2006.01)
*H03M 13/03* (2006.01)

(52) U.S. Cl. .................. 714/796; 714/780; 714/795

(58) Field of Classification Search .................. 714/792, 714/794, 795, 796
See application file for complete search history.

(56) References Cited

U.S. PATENT DOCUMENTS

| | | | | |
|---|---|---|---|---|
| 5,257,272 A * | 10/1993 | Fredrickson | ................ | 714/792 |
| 5,889,823 A | 3/1999 | Agazzi et al. | | |
| 6,070,263 A * | 5/2000 | Tsui et al. | ................ | 714/795 |
| 6,147,964 A * | 11/2000 | Black et al. | ................ | 370/209 |
| 6,445,755 B1 * | 9/2002 | Chung et al. | ................ | 375/341 |
| 6,606,724 B1 * | 8/2003 | Krieger et al. | ................ | 714/755 |
| 6,807,240 B2 * | 10/2004 | Alamouti et al. | ............ | 375/341 |
| 6,931,585 B1 | 8/2005 | Burd et al. | | |
| 7,047,474 B2 * | 5/2006 | Rhee et al. | ................ | 714/755 |
| 7,155,660 B1 * | 12/2006 | Burd | ............ | 714/795 |
| 7,173,985 B1 * | 2/2007 | Diaz-Manero et al. | ........ | 375/341 |
| 7,206,363 B2 * | 4/2007 | Hegde et al. | ................ | 375/341 |
| 7,646,821 B1 * | 1/2010 | Lou et al. | ................ | 375/262 |
| 7,646,829 B2 * | 1/2010 | Ashley et al. | ................ | 375/340 |
| 7,783,963 B2 * | 8/2010 | Huggett et al. | ............ | 714/795 |
| 2003/0221156 A1 * | 11/2003 | Berger et al. | ................ | 714/755 |

FOREIGN PATENT DOCUMENTS

EP  1 069 689 A2  1/2001

OTHER PUBLICATIONS

PCT/US2007/022412 International Search Report dated Sep. 2, 2008.

* cited by examiner

*Primary Examiner* — Ajay Bhatia
*Assistant Examiner* — Daniel McMahon

(57) ABSTRACT

A system, apparatus, and method are provided for a nonlinear Viterbi detector that may be used in an iterative decoding system or any other system with multiple, interconnected detectors. At least one of the Viterbi detectors may estimate the digital information sequence in a received signal based on the signal itself and an estimate of the signal from another of the Viterbi detectors. The at least one Viterbi detector may calculate branch metrics for a subset of the branches in an associated trellis diagram by selecting branches that correspond to the output of the other Viterbi detector.

62 Claims, 20 Drawing Sheets

FORWARD DECISION AIDED NONLINEAR VITERBI DETECTOR

CROSS-REFERENCE TO RELATED APPLICATION

This application claims the benefit under 35 U.S.C. §119(e) of U.S. Provisional Application No. 60/829,949, filed Oct. 18, 2006, which is hereby incorporated herein by reference in its entirety.

BACKGROUND OF THE INVENTION

This application relates generally to digital signal detection, and more particularly to a nonlinear Viterbi detector for use in an iterative decoding system.

With the continuing demand for high-speed digital communications systems and high-density digital storage systems, various techniques have been applied to increase the capacity of these systems. For example, in magnetic media storage, many manufacturers are using perpendicular recording rather than traditional longitudinal recording to pack more information into a smaller area. However, as data speeds and storage densities are pushed to their limits and beyond, the amount of signal distortion on information-carrying signals have increased dramatically. Thus, detectors are heavily relied upon to interpret the information in these highly distorted signals.

In fact, digital transmission and storage systems have reached a point where signal-dependent noise, such as transition jitter, often overwhelm signal-independent, white noise. Therefore, nonlinear Viterbi detectors, designed to whiten signal-dependent noise, are currently being used in place of their less-effective linear counterparts. However, current nonlinear Viterbi detectors are highly complex. They may also have high power consumption and large area because of high throughput requirements. In iterative decoding systems and other systems that utilize multiple nonlinear detectors, the complexity, area, and power requirements of current nonlinear Viterbi detectors may be overly costly. Therefore, it would be desirable to provide techniques for reducing the complexity, area, and/or power requirements of nonlinear Viterbi detectors for iterative decoding systems and other systems where multiple Viterbi detectors are used.

SUMMARY OF THE INVENTION

Systems and methods are provided for a nonlinear Viterbi (NLV) detector that may be used in an iterative decoding system, where information from another detector may be used by the NLV detector.

An iterative decoding system in accordance with an embodiment of the present invention may include one or more interconnected Viterbi detectors, where the output of the kth detector is an input into the (k+1)th detector. Each of the one or more detectors in the iterative decoding system may estimate the digital information sequence contained within a distorted, noisy signal obtained from a digital communications or digital storage channel. Thus, the (k+1)th detector may estimate the digital information sequence based on both the received noisy, distorted signal and the estimate of this signal computed by the kth detector.

In accordance with an embodiment of the present invention, a Viterbi detector may use a trellis diagram to aid in estimating a digital information sequence. The trellis diagram graphically illustrates each possible digital information sequence that may have been transmitted, where one of these paths represents the sequence that was actually transmitted. For each symbol period, the Viterbi detector may calculate branch metrics for branches leading away from states in the trellis diagram that correspond to a previous time interval. Using the calculated branch metrics, the detector may determine the path that has the highest probability of being the correct path. In particular, the detector may determine this highest-probability path using the Viterbi algorithm. The digital sequence associated with this path may be an estimate of the true digital information sequence, and is preferably output by the Viterbi detector as a soft or hard output.

To calculate branch metrics in a detector, the detector may include a branch metric computation unit. The branch metric computation unit preferably outputs a plurality of branch metrics for different branches leading away from states corresponding to a previous time interval. Because noise characteristics of a signal may depend on previous values of the signal (e.g., the states of the previous time interval), the branch metric computation unit may include a plurality of nonlinear filters to separately process the noisy signal according to each state in the previous time interval. The plurality of nonlinear filters preferably remove the correlation, or "whiten," any signal-dependent noise affecting the received signal. These processed signals may then be used to compute branch metrics for the different branches.

To reduce the complexity of a Viterbi detector, instead of computing branch metrics for every branch in a trellis diagram, branch metrics for a subset of the branches may be calculated. The selected branches preferably include the branch corresponding to the actual digital information sequence. To determine which branches to select, a Viterbi detector in an iterative decoding system or other multi-detector system may use information from another detector. In particular, a detector may obtain an estimate of one or more bits of the digital information sequence from the other detector, and may calculate branch metrics for branches that lead away from states in the trellis corresponding to the estimate. Thus, as one example, for a 16-state trellis diagram with 32 branches between two consecutive time intervals, 16 branch metrics may be computed. With half or fewer total branch metrics, the selection of paths through the trellis diagram may also be simplified.

Although branch metrics are calculated for only a subset of all the branches in a trellis diagram, the detector may have similar performance to one that computes branch metrics for every branch. To maintain similar performance, the detector preferably computes branch metrics that have substantially the same resolution as detectors that compute branch metrics for every branch. Because these branch metrics are associated with branches that are most likely to affect the final estimate of the digital information sequence, the detector preferably maintains similar performance. In order to compute high-resolution branch metrics, the detector preferably processes a received signal for signal-dependent noise with the same degree of precision. For example, a detector may maintain the nonlinear filtering associated with a 16-state trellis even if only 16 branch metrics, typically associated with an 8-state trellis, are computed. With these properly noise-whitened signals, the detector may have the same information for producing branch metrics as a detector that computes branch metrics for every branch. Thus, the present invention provides a way to reduce the total number of branch metrics computed (e.g., from 32 branch metrics to 16), which may allow for a decrease in complexity and hardware area by substantially half or more, without a significant reduction in detection performance.

Thus, in accordance with some embodiments of the present invention, a plurality of branch metrics may be calculated by first obtaining an estimate of one or more bits of a digital information sequence from a second detector. The one or more bits preferably correspond to recent information contained in a signal received from a digital communications or digital storage system. Branch metrics may then be calculated for branches in a trellis diagram that correspond to the obtained estimate. These branches may be branches that lead away from states in the trellis diagram that have values that are equivalent to values of the one or more bits. The branch metrics can be calculated by separately filtering the received signal for signal-dependent noise. The signals resulting from the separate filtering are preferably used to calculate branch metrics for branches associated with the signal dependency.

In accordance with some embodiments of the present invention, a plurality of branch metrics may be calculated from a received signal, where the received signal can correspond to a digital information sequence. The received signal is preferably filtered based on possible values of a predetermined number of recently received bits of the digital information sequence. The received signal may be filtered a plurality of times by separate filters. The plurality of filters preferably produce a plurality of noise-whitened signals, each of which may be associated with one or more of the different branches. Also, the value of one or more of the recently received bits may be determined. The value may be obtained from a detection decision from a second detector. Based on both the filtered signals and the value of the one or more bits, a plurality of branch metrics may be calculated. In particular, the filtered received signal may be used to calculate branch metrics for branches that correspond to the determined value of the one or more bits.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The disclosed technology provides systems and methods for calculating branch metrics in a Viterbi detector, where the Viterbi detector is one of a plurality of interconnected detectors.

Figure 1:
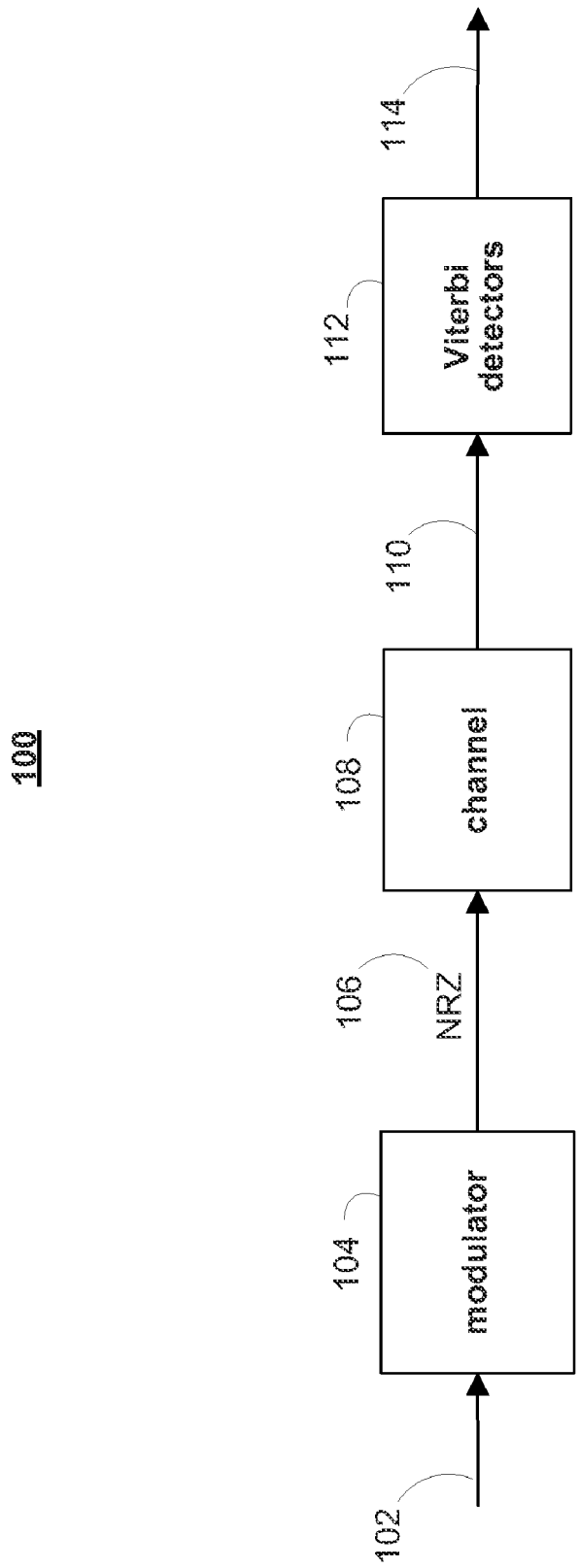
FIG. 1 shows a simplified diagram of a digital storage or digital communications system.

FIG. 1 shows illustrative system 100 of a basic digital communications or storage system. Communications or storage system 100 may include modulator 104, channel 108, and Viterbi detectors 112. Modulator 104 preferably converts digital information 102 into signal 106. Digital information 102 may represent any type of information to be conveyed (e.g., a sampled/quantized version of an analog signal, binary information, etc.) and may be in any suitable digital form (e.g., coded data, uncoded data, etc.). Digital information 102 may be supplied by any suitable digital source. For example, the source can be, but is not limited to, a source encoder, an encoder for an error correcting/detecting code (e.g., a convolutional encoder, a Reed-Solomon encoder, a CRC code, etc.), a computer user data file, a magnetic storage device (e.g., a hard disk), an electrical storage device (e.g., RAM), or an optical storage device (e.g., a compact disk). Modulator 104 may modulate digital information 102 using any suitable carrier signal and at any suitable frequency (e.g., baseband signal, passband signal, etc.). Thus, signal 106 may have any suitable signal properties. In some embodiments, the signal provided by modulator 104 may be a non-return-to-zero (NRZ) signal. That is, signal 106 may not have a rest (or zero) state in between information-carrying states. In other embodiments, signal 106 may be a return-to-zero signal. However, for simplicity, it will be assumed that modulator 104 provides an NRZ signal.

Before NRZ signal 106 reaches a destination, signal 106 may be altered by channel 108. Channel 108 represents a medium or media that can distort signal 106. Thus, output 110 of channel 108 may be a distorted version of NRZ signal 106. For digital communications systems, channel 108 that distorts signal 106 may be a wired or wireless media through which the signal travels. For digital storage systems, channel 108 may be the media in which the digital information is stored. Thus, the source and the channel of a digital storage system may be the same device. In some embodiments, the digital storage system can be a magnetic storage device, such as a hard disk. In these embodiments, the channel is referred to as a magnetic recording channel.

The particular type and degree of signal distortion on NRZ signal 106 can depend on the characteristics of channel 108. The signal distortion may also depend on the speed at which information is sent (for digital communications systems) or the density of stored information (for digital storage systems).

Figure 2:
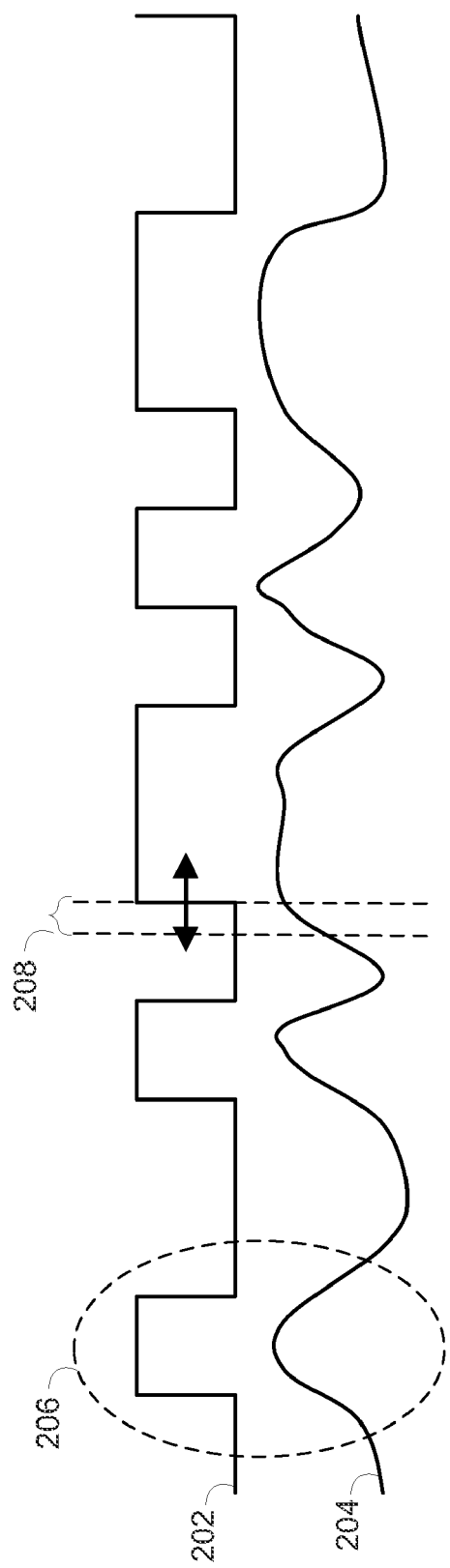
FIG. 2 shows illustrative signals that correspond to a bit stream.

Referring now to FIG. 2, signals 202 and 204 illustrate signal distortion that may be caused by a magnetic recording channel. Signal 202 represents an ideal, intended signal provided by a magnetic recording device (e.g., NRZ signal 106 of FIG. 1), and signal 204 represents the actual signal provided by the magnetic recording device (e.g., distorted signal 110). The differences between signal 202 and signal 204 may be caused by the properties of the magnetic recording channel. In particular, the magnetic recording channel can cause inter-symbol interference. That is, the channel can spread the signal such that neighboring areas of the signal, which are meant to be separate, affect each other. Inter-symbol interference is illustrated, for example, by region 206 of FIG. 2, where a clean pulse in signal 202 is spread to a smooth curve in signal 204. Also, the magnetic recording channel can cause transition jitter, where the "edges" of the actual signal do not coincide with the edges of the ideal signal. Transition jitter is illustrated, for example, by time difference 208, which shows the approximate time difference between a low-to-high transition in signal 202 and the corresponding low-to-high transition in signal 204.

In addition to signal distortion caused by a channel (e.g., channel 108 (FIG. 1) which may be a magnetic recording channel), a signal may also be affected by noise that is not correlated to the characteristics of the channel. This type of noise is typically referred to as additive noise. In some situations, the additive noise that affects a signal may be modeled as additive white Gaussian noise (AWGN). The channel is then referred to as an AWGN channel.

A channel, such as a magnetic recording channel that may distort signal 202 to signal 204 (FIG. 2), may be represented by a channel response, or a "target." For example, a target for a perpendicular magnetic recording channel may be given by h=[4,7,1,0,0]. This particular channel may be referred to as having five "taps," because it is characterized by five values. For an NRZ signal that may take on a value of either +1 or −1, represented by the variable X, ∈{±1}, the resulting signal after distortion by the magnetic recording channel may be given by $$Y_t = \sum_{i=0}^{m} X_{t-i} h_i + n_t,$$

where h is the target and n is additive noise with zero mean and a variance of $\sigma^2$. In particular, the distorted signal may be given by the convolution of the target and the NRZ signal with AWGN. The convolution of the target and the NRZ signal for some t will hereinafter be referred to as the variable, $V_t$.

The present invention can be used for any channel, and is not limited to magnetic recording channels. Other distortion effects that may occur on a communications or storage channel include, but are not limited to, inter-track interference or cross-talk, erasures, fades, reflections, and other filtering effects. As will be explained in detail below, any of these or other channel effects may be countered by the present invention. In particular, the present invention may be capable of combating these signal distortion effects regardless of whether they are signal-dependent or signal-independent.

Referring back to FIG. 1, signal 110 at the output of channel 108 may be a distorted version of NRZ signal 106. For example, signal 110 from channel 108 may be similar to distorted signal 204 of FIG. 2. Viterbi detectors 112 may be used to interpret the information carried by signal 110. In particular, Viterbi detectors 112 preferably attempt to recover digital information 102 from noisy, distorted signal 110. Thus, Viterbi detectors 112 preferably output an estimate of digital information 102 at output 114. Viterbi detectors 112 may output a hard or soft estimate of digital information 102. That is, Viterbi detectors 112 may output a sequence of binary digits corresponding to digital information 102, or Viterbi detectors 112 may output a sequence of likelihoods that a given digit in digital information 102 is a '0' or '1.' Thus, if detectors 112 are able to accurately recover digital information 102, output 114 of detectors 112 may be the same as information 102, or output 114 may be another representation of information 102. The accuracy of output 114, and therefore the particular output of Viterbi detectors 112, may depend on the degree and type of distortion caused by channel 108.

Figure 3:
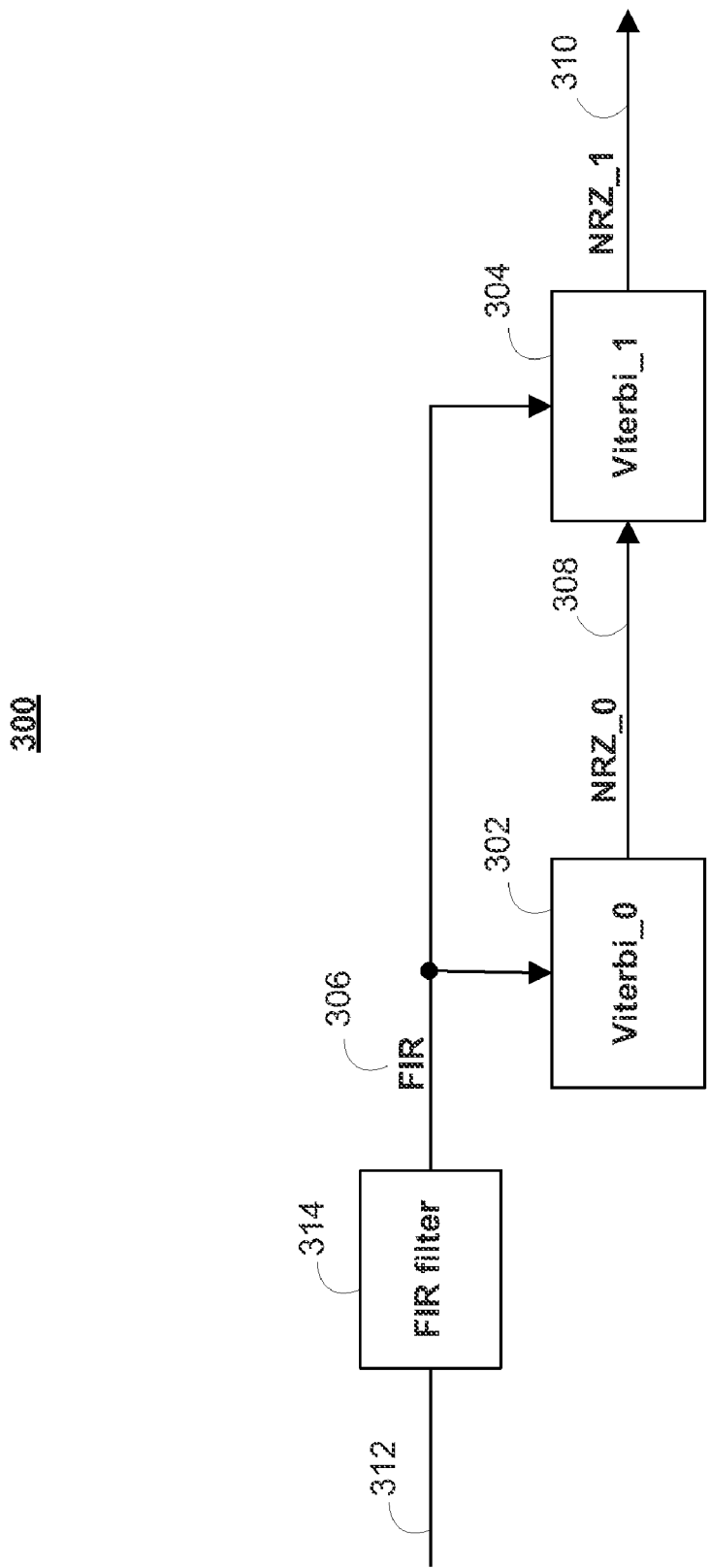
FIG. 3 shows a simplified block diagram of Viterbi detectors for an iterative decoding system.

Referring now to FIG. 3, block diagram 300 is a simplified diagram of two Viterbi detectors that may be used in an iterative decoding system. Block diagram 300 may represent a configuration of detectors for detectors 112 of FIG. 1. Block diagram 300 may include filter 314, Viterbi detector 302, and Viterbi detector 304. In some embodiments, filter 314 may be a finite impulse response (FIR) filter. Filter 314 may be used to preprocess received signal 312, which may have similar characteristics to noisy, distorted signal 110 of FIG. 1. Filter 314 may preprocess received signal 312 to, for example, reduce the amount of additive white noise. For simplicity, it will be assumed that filter 314, and any similar preprocessing filter, is a FIR filter. Thus, the output of these filters (e.g., output 306) will be referred to as a FIR signal.

Viterbi detectors 302 and 304 of FIG. 3 may be any suitable type of Viterbi detector (e.g., soft-output detector, hard-output detector, nonlinear detector, linear detector, etc.). Based on FIR signal 306, each of detectors 302 and 304 preferably estimate the information carried by the received signal, and preferably output their estimates as NRZ_0 signal 308 and NRZ_1 signal 310, respectively. Viterbi detector 304, in addition to making decisions based on FIR signal 306, may also utilize information from NRZ_0 signal 308 from the output of Viterbi detector 302 to estimate the transmitted or stored information. In FIG. 3, Viterbi detector 304 is the final detector in a chain of two detectors. Thus, the output of Viterbi detector 304 may be used as the overall output of block diagram 300. If the detector configuration of block diagram 300 is used for detectors 112 of FIG. 1, output 310 of Viterbi detector 304 may correspond to output 114.

The combination of detector 302 and detector 304 may provide better detection performance than a single detector. In particular, detector 304, which uses both FIR signal 306 and NRZ_0 estimate 308 from detector 302, may improve upon the detection decision produced by detector 302. If a third detector were added to block diagram 300, it could be contemplated that the third detector would increase the reliability further by providing an estimate based on both FIR signal 306 and output NRZ_1 of detector 304. In fact, block diagram 300 may include any suitable number of detectors, where the (K+1)th Viterbi detector of block diagram 300 may make decisions based on the output of one or more of these previous k Viterbi detectors. The final Viterbi detector preferably provides the overall output of block diagram 300, and may output hard information or soft information depending on whether a soft output or hard output is desired (e.g., at output 114 or FIG. 1). In some embodiments, the output of the final Viterbi detector may be passed to an error correction decoder (e.g., an LDPC decoder) to further improve the reliability of the estimate (not shown).

Figure 4A:
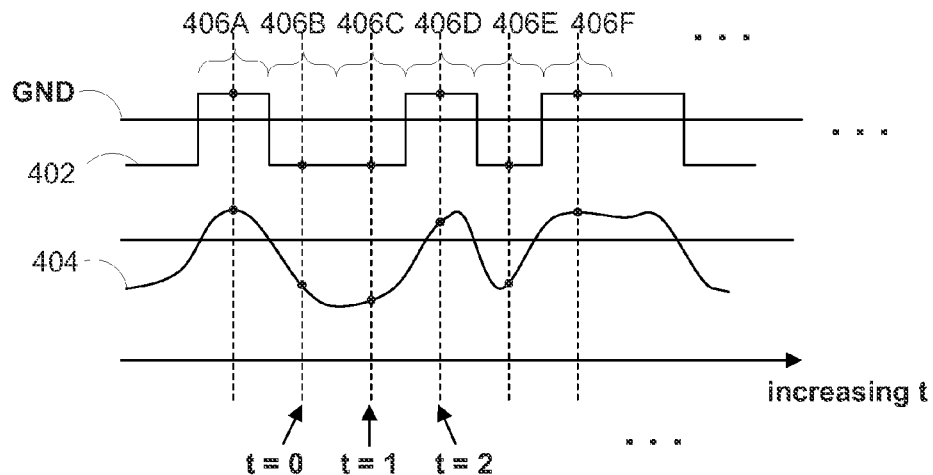
FIG. 4A illustrates a digital information sequence associated with the signals of FIG. 2.

Each Viterbi detector in block diagram 300 may attempt to interpret the digital information sequence contained in a noisy, distorted received signal. Referring now to FIG. 4A, one representation of the digital information within signals 202 and 204 of FIG. 2 is shown. These signals are reproduced as signals 402 and 404 in FIG. 4A, respectively. Signal 402 can take on values of +1 (HIGH) or −1 (LOW). The value of signal 402 during each time interval, or "symbol periods" 406A-406F, can convey a portion of the digital information sequence. In particular, the value of the signal during a symbol period may present information about a "symbol," or group of bits, in the digital information sequence. For the example of FIG. 4A, each symbol period represents information about a one-bit symbol. In particular, a HIGH signal level may represent a '1' in the digital information sequence, and a LOW signal level may represent a '0' in the digital information sequence. Thus, signal 402 may be an NRZ signal representation of a bit sequence given by "100101 . . . " From noisy and distorted signal 404, a detector may attempt to recover this sequence.

It should be understood that a transmitted or played back digital information sequence may be conveyed in any suitable way. For example, in some embodiments, each symbol period may correspond to a symbol of more than one bit. In these embodiments, the signal may have more than two levels (e.g., 4, 16, etc.). In still other embodiments, the signal may be a return-to-zero signal.

Figure 4B:
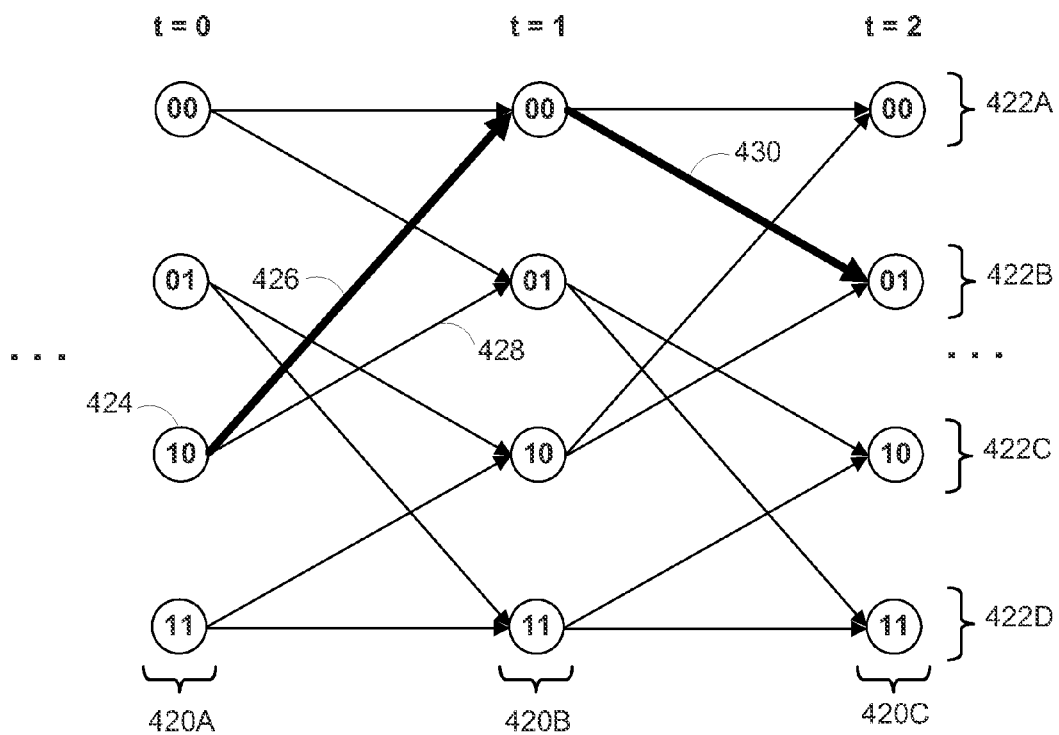
FIG. 4B shows a trellis diagram illustrating a path corresponding to the digital information sequence of FIG. 4A.

A digital information sequence, such as the sequence shown in FIG. 4A, may be represented by a particular path in a trellis diagram. A trellis diagram is a state-based, graphical representation of all the possible permutations that a digital information sequence may take. The vertical axis typically shows states corresponding to different bit sequences, and the horizontal axis typically shows states at different time periods. FIG. 4B shows one embodiment of a four-state trellis diagram. On the vertical axis, states 422A correspond to a recent bit sequence of "00," states 422B correspond to a recent bit sequence of "01" (where '1' is the most recent bit), states 422C correspond to a recent bit sequence of "10," and states 422D correspond to a recent bit sequence of "11." On the horizontal axis, states 420A, 420B, and 420C represent states of consecutive symbol periods. Each state has two branches leading to states at a next time interval. For example, branches 426 and 428 set out from state 424, a "10" state. From state 424, if the next bit in the signal is detected as '0,' the three most recent bits would be "100." Because a four-state trellis diagram only keeps track of the most recent two bits, "100" belongs in a "00" state (states 422A), so branch 426 would be taken. If instead, a '1' is detected next, the sequence at the next symbol period would become "101," and branch 428 leading to a "001" state (states 422B) would be taken. Therefore, referring to both FIGS. 4A and 4B, signal 402 of FIG. 4A would correspond to a trellis path in FIG. 4B that includes branch 426 and branch 430. This path is highlighted in FIG. 4B for emphasis.

In general, a trellis diagram can keep track of the most recent M bits. The trellis diagram would then have up to $2^M$ states at each time interval. In some embodiments, a trellis diagram may have fewer than $2^M$ states at some time intervals. For example, a trellis diagram may have fewer states if the corresponding digital information sequence is a message encoded using an error correction code (ECC) (e.g., a ½-rate convolutional code). That is, coding would restrict the number of possible information sequences, which in turn would reduce the number of states in the trellis representation. Also, in these and other embodiments, each branch may represent multiple binary digits.

A detector, such as detector 302 or 304 of FIG. 3, preferably attempts to determine the information in a signal by finding a corresponding path in a trellis diagram. As described above, the trellis diagram used by a detector could be of any suitable size, and may be chosen based on the effects of a channel. A suitable size for a trellis may depend on the number of channel taps. For example, the five-tap perpendicular recording target given by h=[4,7,1,0,0], which generates a received signal of $$Y_t = \sum_{i=0}^{m} X_{t-i} h_i + n_t,$$

may need a trellis that keeps track of four previous bits: $X_{-4}$, $X_{-3}$, $X_{-2}$, and $X_{-1}$. This would allow the detector to treat a received signal differently depending on the values of the previous four bits. Thus, for this particular channel, a 16-state trellis may be desirable.

A detector preferably finds a trellis path by utilizing the Viterbi algorithm, which is well known. Using the Viterbi algorithm, a detector can find the path that corresponds to the highest probability of being the correct path. This type of detector is referred to as a maximum-likelihood detector. Thus, even if a signal is distorted to a signal similar to or more distorted than signal 404 of FIG. 4A, the detector may still be able to recover the information in the signal. The Viterbi algorithm will be briefly described below with reference to FIG. 5. It should be understood, however, that the description is simplified and illustrative, and should not limit the present invention in any way.

Figure 5:
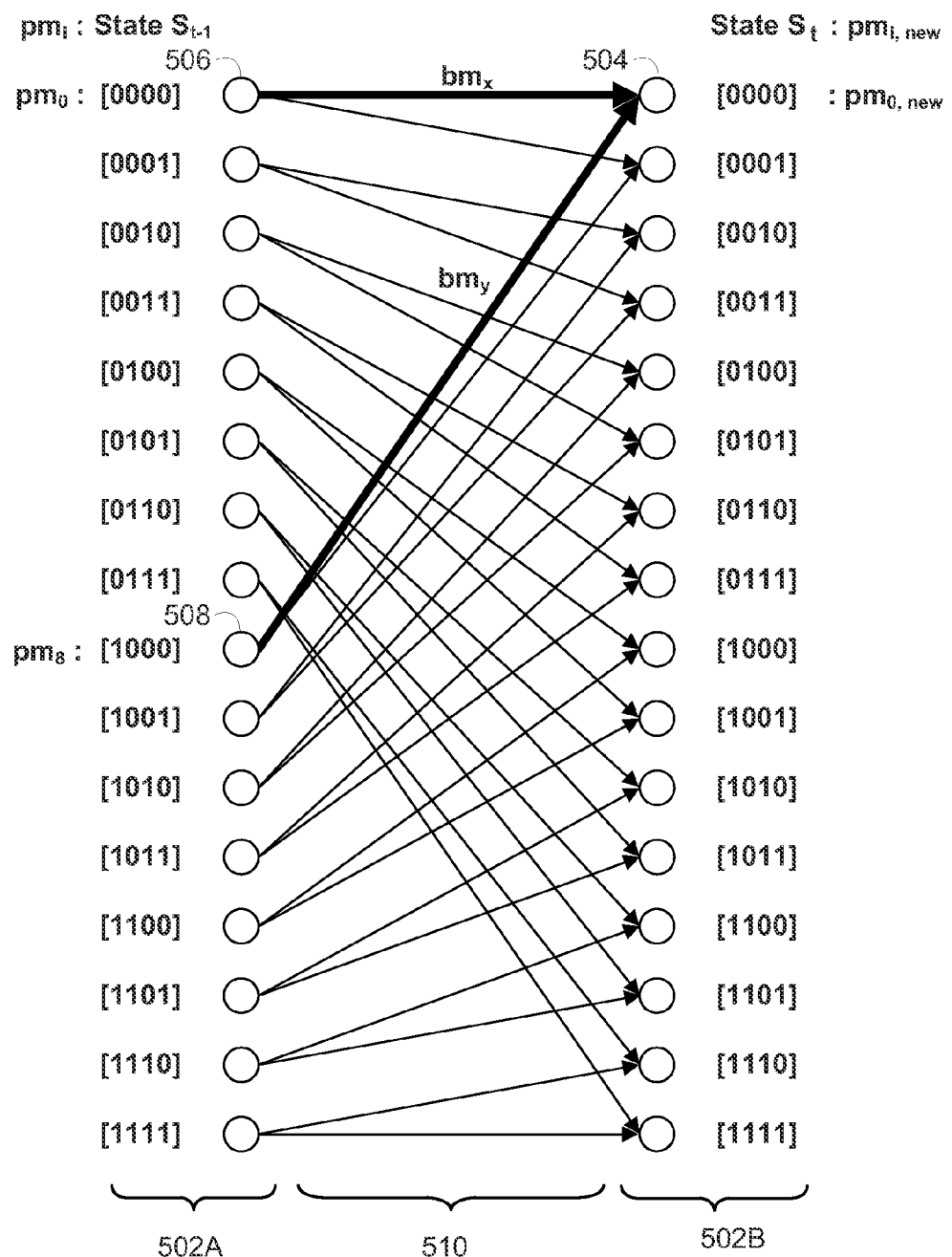
FIG. 5 illustrates a state transition in a 16-state trellis diagram.

Referring now to FIG. 5, two time intervals of a 16-state trellis diagram are illustrated. Each state, $S_{t-1}$, among states 502A may have many previous partial paths leading to that state (not shown). Of all the partial paths leading to that state, one partial path is a partial path that has the highest probability of corresponding to the actual information sequence. This partial path may be referred to as the most likely path for that state. Each state in $S_{t-1}$ (states 502A) has an associated most likely path. Of all of the states in states 502A, the state with the most likely path having the highest probability is referred to as the "best state" for that time interval, and the corresponding path is referred to as the "best path." Typically, rather than associating each partial path with a probability, each partial path may be associated with a path error value. Using this standard, the partial path with the lowest path error value may be the most likely path for a state. This path error value will be referred to herein as the "path metric," or simply "pm." In the 16-state trellis diagram of FIG. 5, the ith state of states 502A, where 0<i<15, is associated with a path metric given by $pm_i$.

When a new symbol period is processed by a detector, the detector can determine the path metrics associated with the 16 new states in the next symbol period, $S_t$ (states 502B). The path metrics for the states in this next time interval are based on the path metrics at the previous time interval, $pm_i$, and on the probabilities, or branch error values, associated with branches 510 between the two time intervals. The branch error value associated with each of the 32 branches (two each from the 16 $S_{t-1}$ states) in branches 510 is referred to as a "branch metric." A detector can find the most likely partial path leading to each of states 502B. For example, the most likely partial path leading to state 504 is either the most likely partial path to state 506 followed by a [0000]→[0000] branch, or the most likely partial path to state 508 followed by a [1000]→[0000] branch. To quantitatively find the most likely partial path, a detector can determine the associated path metrics for these two options. In particular, a detector may calculate $(pm_o+bm_x)$ and $(pm_8+bm_y)$. The path metric, $pm_{o,new}$, for state 504 may be set to the lower of the two sums, and the most likely path to state 504 may be given by the path associated with the lower of the two sums. This path is referred to as the "winning path" or the "surviving path," while the higher sum path is referred to as the "losing path." Accordingly, after computing the new potential path metrics for each of states 502B, the detector may retain the 16 winning paths to states 502B. The best state of states 502B may be the minimum of $pm_{i,new}$. The detector may continue to move to new states at new time intervals in a similar manner, and may continue to calculate the best state at each time interval.

Figure 6:
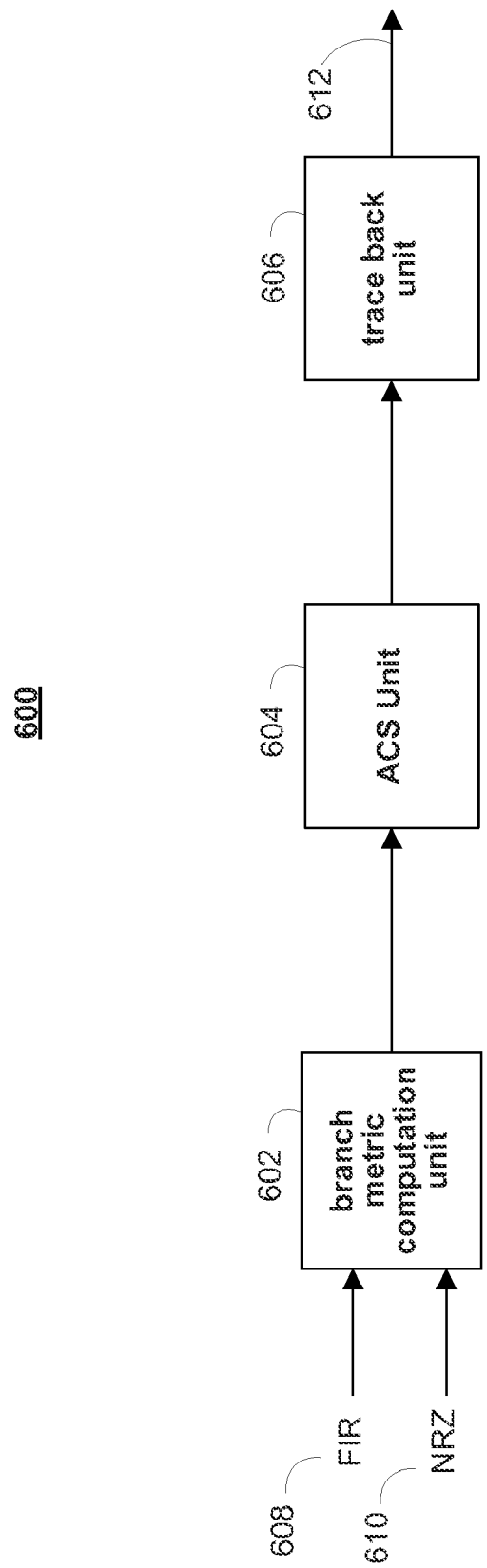
FIG. 6 shows a simplified block diagram of a Viterbi detector.

Referring now to FIG. 6, a simplified block diagram of illustrative detector 600 is shown. Detector 600 preferably includes branch metric computation unit 602, ACS unit 604, and trace back unit 606. Detector 600 can implement the Viterbi algorithm, as described above in connection with FIG. 5. In particular, branch metric computation unit 602 may determine branch metrics associated with each possible branch. For example, for a 16-state trellis, branch metric computation unit 602 may compute up to 32 branch metrics. Thus, branch metric computation unit 602 preferably determines the values of $bm_x$ and $bm_y$ in the example of FIG. 5. In some embodiments, branch metric computation unit 602 may determine branch metrics based on a signal obtained from a channel. In other embodiments, branch metric computation unit 602 may determine branch metrics based on a signal that has been equalized by a finite input response (FIR) filter or other type of filter/equalizer (not shown). Thus, the input into branch metric computation unit 602 preferably is FIR signal 608. Branch metric computation unit 602 may also make estimation decisions based on NRZ input 610, which may be obtained from the output of another Viterbi detector. For example, the branch metric computation unit of detector 304 of FIG. 3, if applicable, may make estimation decisions based on the NRZ output of detector 302. Detailed branch metric computation units will be described below with reference to FIGS. 9 and 10.

The branch metrics provided by branch metric computation unit 602 preferably are used by add-compare-select (ACS) unit 604 to determine the path metric for each state in a current symbol period. ACS unit 604 can perform the three operations of adding, comparing, and selecting. In particular, ACS unit 604 preferably adds previous path metrics with the branch metrics provided by branch metric computation unit 602 to determine two new potential path metrics for each current state. ACS unit 604 preferably then compares the potential path metrics for each current state and may select the path corresponding to the smaller potential path metric as the winning path for that state. For the example of FIG. 5, ACS unit 604 preferably computes $(pm_o+bm_x)$ and $(pm_8+bm_y)$ and preferably selects the lower of the two sums. In some embodiments, Viterbi detector 600 implements a soft-output Viterbi algorithm (SOVA), which can output soft information. In these embodiments, ACS unit 604 may also compute a reliability indicator associated with choosing the winning path. The reliability indicator may be in the form of a log-likelihood ratio for each information bit in the digital information sequence. Various implementations of ACS units for soft and hard output Viterbi detectors are known, and the present invention is not limited to any particular implementation.

At a suitable time, trace back unit 606 can recall the partial path that corresponds to the best path. In this way, trace back unit 606 can output the maximum-likelihood sequence for a given received signal. For soft-output Viterbi algorithm (SOVA) detectors, trace back unit 606 may also recall reliability indicators associated with each state. Thus, trace back unit 606 may output either hard or soft information at output 610. Trace back unit 606 may include a storage system, such as RAM, to store pointers back through the trellis diagram that represent winning paths. In some embodiments, the storage system may also store reliability indicators.

Figure 7:
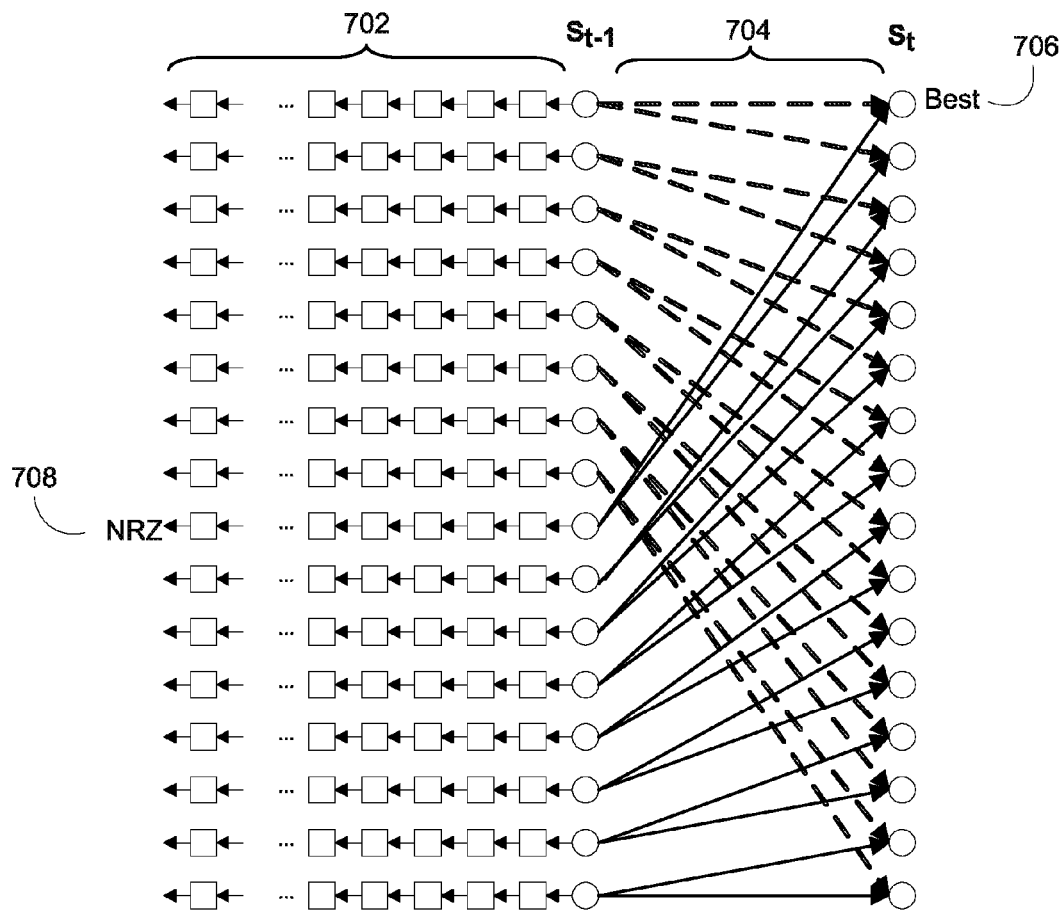
FIG. 7 illustrates winning paths for a 16-state detector with finite path memory.

Referring now to FIG. 7, and with continuing reference to FIG. 6, the functionality of trace back unit 606 is illustrated. As described above in connection with FIG. 5, each of states $S_{t-1}$ has an associated winning path. These winning paths are illustrated by previous states 702, where each square represents a state in a trellis diagram. Trace back unit 606 preferably keeps track of the surviving paths for each of states $S_{t-1}$ by storing pointers (shown as right-facing arrows) that travel backwards through the trellis diagram. Because of memory limitations, design choice, or for any other reason, the number of states stored by trace back unit 608 may be limited to some finite number (e.g., 55, 100, 1000 states). In addition to storing the winning path for each state, trace back unit 606 may also store associated path metrics for each of the surviving paths. These path metrics may also be limited to a finite number of previous states (e.g., 55 states).

At a next symbol period, ACS unit 604 of FIG. 6 preferably selects winning paths for states $S_t$. That is, of the 32 branches between states $S_{t-1}$ and states $S_t$, half of them may correspond to winning paths, while the other half may be discarded. For illustration purposes, the best state of states $S_t$—that is, the state with the lowest path metric—may be given by state 706. Thus, to output a detection decision, trace back unit can produce a soft or hard estimate of the transmitted digital information sequence as an NRZ signal corresponding to path 708.

Various implementations of trace back units for Viterbi detectors are known. The present invention is not limited to any particular implementation.

It should be understood that the description above of detector 600 (FIG. 6) is merely illustrative, and is intended to show that detector 600 is capable of implementing the Viterbi algorithm, as simply described above in connection to FIG. 5. Thus, detector 600 can include any other components that may, for example, enhance the performance or functionality of detection. Furthermore, any of the above described components may be modified or combined without leaving the scope of the invention.

In conventional linear Viterbi detectors, any noise affecting a received signal is assumed to be independent of the transmitted or stored information. However, the effect of signal-dependent noise continually increases with newer technologies. For example, transition jitter, an increasingly common effect in magnetic recording channels, may be modeled as a signal-dependent noise. The amount of transition jitter may be affected by the frequency of high-to-low and low-to-high signal transitions. That is, a digital sequence given by "10101" (a trellis branch of [1010]→[0101]), may suffer from stronger transition jitter than a digital sequence of "00000" (a trellis branch of [0000]→[0000]). Thus, nonlinear Viterbi detectors may be used to process signals differently for different branches in a trellis diagram. The signals may be processed by, for example, noise whitening filters that are particularly effective at reducing signal-dependent noise for each possible branch.

Figure 8:
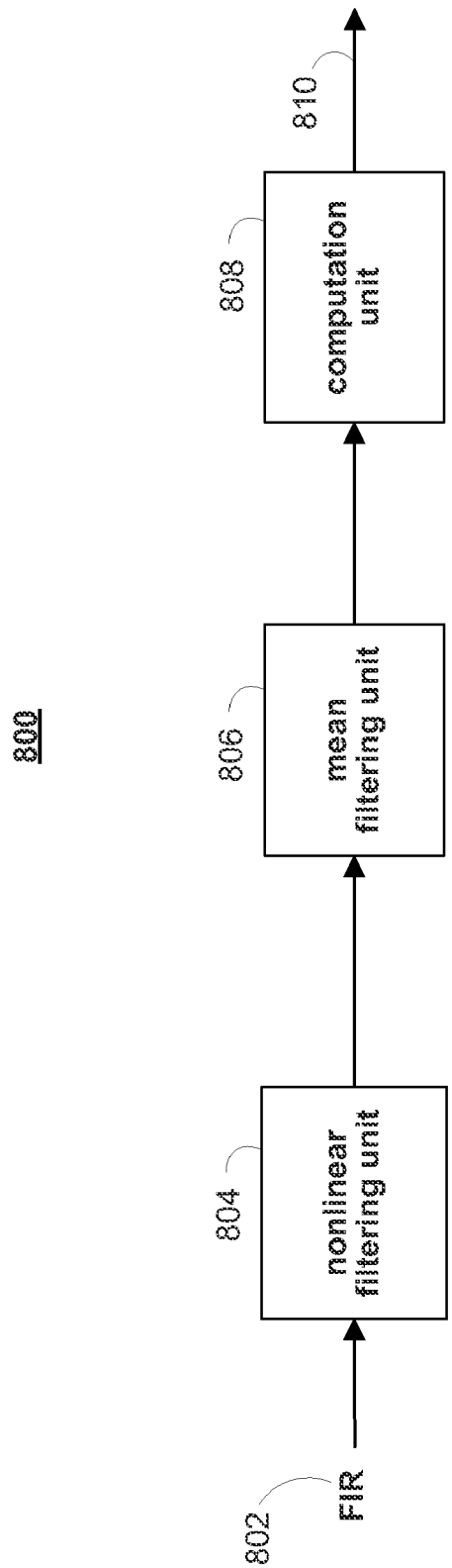
FIG. 8 shows a simplified block diagram of a branch metric computation unit.

Referring now to FIG. 8, nonlinear Viterbi detector 800 is shown that may reduce the effects of signal-dependent noise. Nonlinear Viterbi detector 800 preferably includes nonlinear filtering unit 804, mean filtering unit 806, and computation units 808. FIR signal 802, obtained from a FIR filter (not shown), may be processed by nonlinear filtering unit 804. Nonlinear filtering unit 804 preferably includes noise whitening filters, and may produce a set of noise-whitened signals, where each signal is filtered based on the expected signal-dependent noise associated with a branch in a trellis diagram. Thus, from FIR signal 802, and using a 16-state trellis diagram, nonlinear filtering unit 804 preferably produces a noise-whitened, filtered signal assuming the noise characteristics of a [1010]→[0101] branch, and preferably produces a different noise-whitened, filtered signal assuming the noise characteristics of a [0000]→[0000] branch.

After nonlinear noise-whitening filtering, the set of filtered signals may be further processed by mean filtering unit 806. For each filtered signal from nonlinear filtering unit 804, mean filtering unit 806 preferably removes the expected signal value, or expected mean, of the nonlinear-filtered signal based on channel characteristics and the assumed branch in the trellis diagram corresponding to the filtered signal. In some embodiments of the present invention, removing the expected value of the signal involves subtracting $V_t$ (defined above), or a filtered version of $V_t$, from the noise-whitened signal. Thus, ideally, the remaining signal at the output of mean filtering unit 806 may be a function of any signal-independent noise (e.g., $n_t$, AWGN, etc.). Also, assuming the signal-independent noise has zero mean, the remaining signal may also have zero mean. Based on the output of mean filtering unit 806, computation unit 808 may calculate branch metrics for some or all of the branches between two time intervals in a trellis diagram. Branch metric outputs 810 may be used as inputs into an ACS unit (e.g., ACS unit 604) to determine the most likely path through the trellis diagram.

Figure 9:
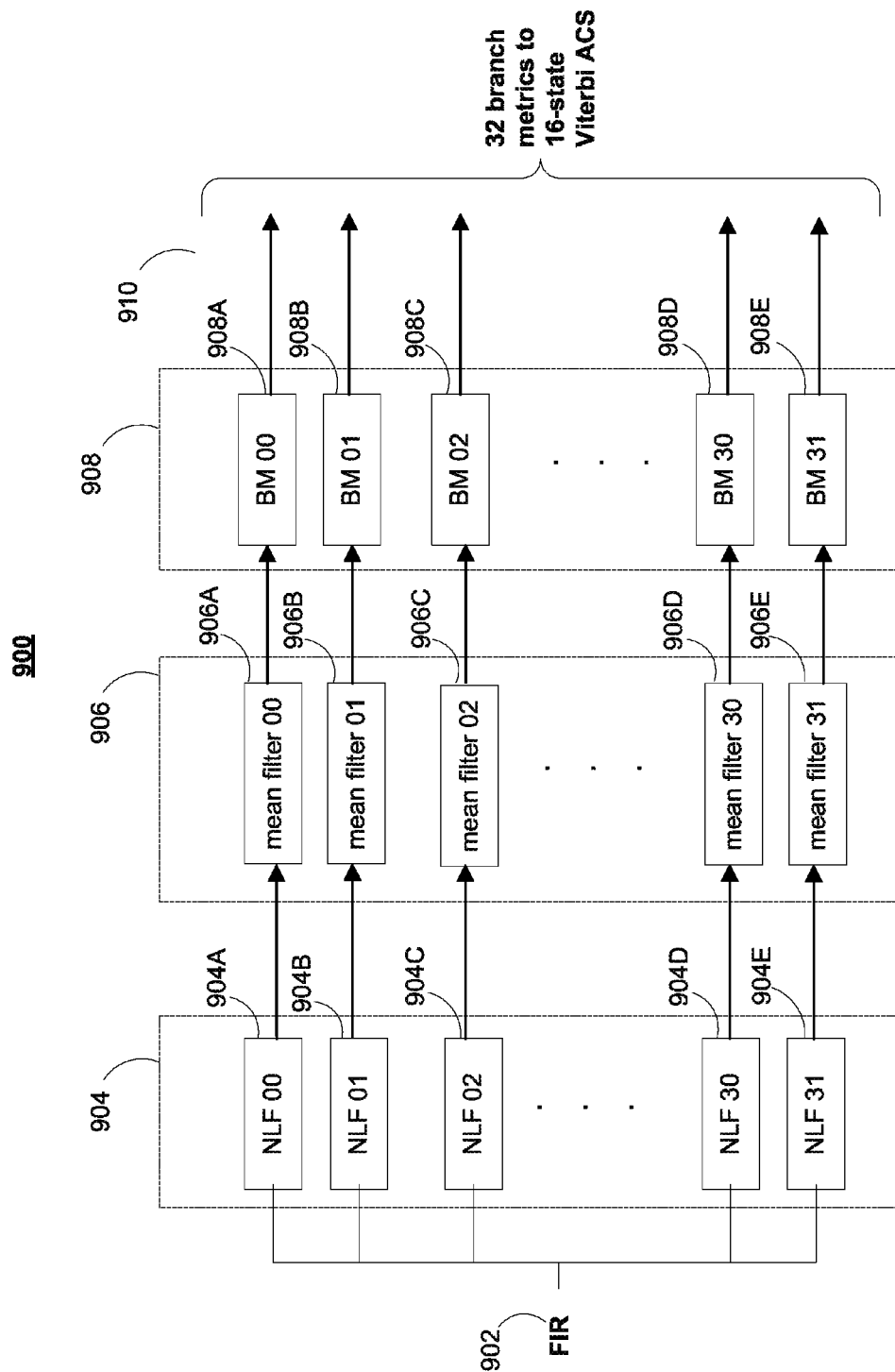
FIG. 9 shows an embodiment of a branch metric computation unit similar to the block diagram of FIG. 8.

Referring now to FIG. 9, a more detailed, yet still simplified, block diagram of a branch metric (BM) computation unit for a 16-state trellis is shown. BM computation unit 900 of FIG. 9 preferably includes nonlinear filtering unit 904, mean filtering unit 906, and computation units 908. Nonlinear filtering unit 904 preferably includes up to 32 nonlinear filters (NLFs) 904A-904E, where each NLF preferably corresponds to a different branch in a 16-state trellis. In particular, each NLF in unit 904 preferably is a noise-whitening filter that whitens noise based on the particular noise characteristics (e.g., transition jitter characteristics) of a particular branch in a trellis diagram. For example, NLF 904A may whiten noise based on the noise characteristics of a [0000]→[0000] branch, and NLF 904E may whiten noise based on the noise characteristics of a [1111]→[1111] branch. However, it should be understood that NLF 904A does not necessary correspond to a [0000]→[0000] branch, and NLF 904E does not necessary correspond to a [1111]→[1111] branch. The 32 NLFs in nonlinear filtering unit 904 may operate on FIR signal 902, or any other input signal, substantially concurrently. Thus, nonlinear filtering unit 904 may output 32 noise-whitened signals at substantially the same time. Although 32 filters are shown in nonlinear filtering unit 904, a different number of nonlinear filters may be used for a different sized trellis diagram (e.g., 16 NLFs for an eight-state trellis, 64 NLFs for a 32-state trellis, etc.). Also, a detector that uses a 16-state trellis diagram may include fewer than 32 NLFs. For example, rather than filtering FIR signal 902 based on a five-bit sequence, nonlinear filtering unit 904 may filter FIR signal 902 based on the most recent four bits. In these embodiments, only 16 NLFs may be included in unit 904.

The up to 32 noise-whitened signals provided by nonlinear filtering unit 904 preferably are filtered further by mean filtering unit 906. Mean filtering unit 906 preferably include up to 32 mean filters 906A-906E, where each mean filter preferably corresponds to a different branch in the 16-state trellis diagram and preferably corresponds to one of the NLFs in nonlinear filtering unit 904. Each mean filter may remove the expected value of a noise-whitened signal corresponding to its associated branch. Thus, mean filter 906A may remove the expected signal value of a noise-whitened signal corresponding to information sequence "00000" (or branch [0000]→[0000]). Similarly, mean filter 906E may remove the expected signal value of a noise-whitened signal corresponding to information sequence "11111" (or branch [1111]→[1111]). However, it should be understood that filter 906A does not necessary correspond to a [0000]→[0000] branch, and filter 906E does not necessary correspond to a [1111]→[1111] branch. Following mean removal, mean filtering unit 906 preferably outputs up to 32 signals that each have zero mean (assuming zero-mean signal-independent noise), and may therefore depend on any remaining signal-independent noise. Although 32 filters are shown in mean filtering unit 904, a different number of mean filters may be used for a different sized trellis diagram (e.g., 16 mean filters for an eight-state trellis, 64 mean filters for a 32-state trellis, etc.).

Computation unit 908 preferably utilizes the zero-mean signals from mean filtering unit 906 to calculate 32 branch metrics for a 16-state trellis diagram. Computation unit 908 preferably includes up to 32 subunits 908A-908E, each of which preferably corresponds to a mean filter from mean filtering unit 906, that may compute branch metrics substantially concurrently. Thus, at the output of branch metric computation unit 900, 32 branch metrics may be provided to a 16-state Viterbi add-compare-select unit at substantially the same time. Although 32 subunits are shown in computation unit 908, a different number of subunits may be used for a different sized trellis diagram (e.g., 16 subunits for an eight-state trellis, 64 subunits for a 32-state trellis, etc.).

With continuing reference to FIG. 9, branch metric computation unit 900 may be operable to compute branch metrics according to, $$BM = \frac{\left(\sum_{i=0}^{L} f_{i,b} Y_{t-i} - \sum_{i=0}^{L} f_{i,b} \hat{Y}_{t-i,b}\right)^2}{2\sigma_b^2} + \frac{1}{2}\log(2\pi\sigma_b^2),$$

for each branch in the trellis diagram. Here, $\hat{Y}_{t,b}$ is the expected signal for a given branch b, Y is FIR signal 902, the L $f_i$s are coefficients of a signal-dependent noise-whitening filter, and $\sigma^2$ is the variance of the noise. Subscript b denotes a dependency on branch b.

Because nonlinear calculations are associated with computing branch metrics for a nonlinear Viterbi detector, branch metric computation units (e.g., branch metric computation unit 900) may be highly complex, high power, and may be large in area (if implemented in hardware). If multiple detectors are used, such as in system 300 of FIG. 3, it may be desirable to decrease the power/complexity/area of at least one of the detectors. One way that the power/complexity/area of a detector could be reduced is by reducing the trellis size used by the detector (e.g., from 16 states to eight). Thus, the number of branch metric computations could be cut at least by half (e.g., from 32 NLFs, mean filters, and computation subunits to 16). However, reducing the size of the trellis reduces the amount of information available for the detector, and may result in a decrease in detection performance. For example, reducing the size of a detector trellis to below 16 states for a five-tap channel may significantly decrease the performance of the detector. In particular, without sufficiently taking into account past events, the nonlinear filtering unit (e.g., nonlinear filtering unit 902 of FIG. 9) of the detector would not be as effective at whitening signal-depending noise. Thus, it would be beneficial to decrease the power/area/complexity of a Viterbi detector without significantly reducing detection performance.

Accordingly, the present invention allows for significant reduction in complexity and area of a detector in a multi-detector configuration without a considerable reduction in performance. As described above in connection with FIG. 3, when multiple detectors are used, at least one of the detectors may take advantage of previous detection decisions obtained from another detector. For example, and again referring back to FIG. 3, Viterbi detector 304 may utilize the NRZ output of Viterbi detector 302. By borrowing decisions from another detector, a detector of the present invention may obtain nearly the performance of an M-state trellis with the complexity of a trellis with fewer than M states.

Figure 10:
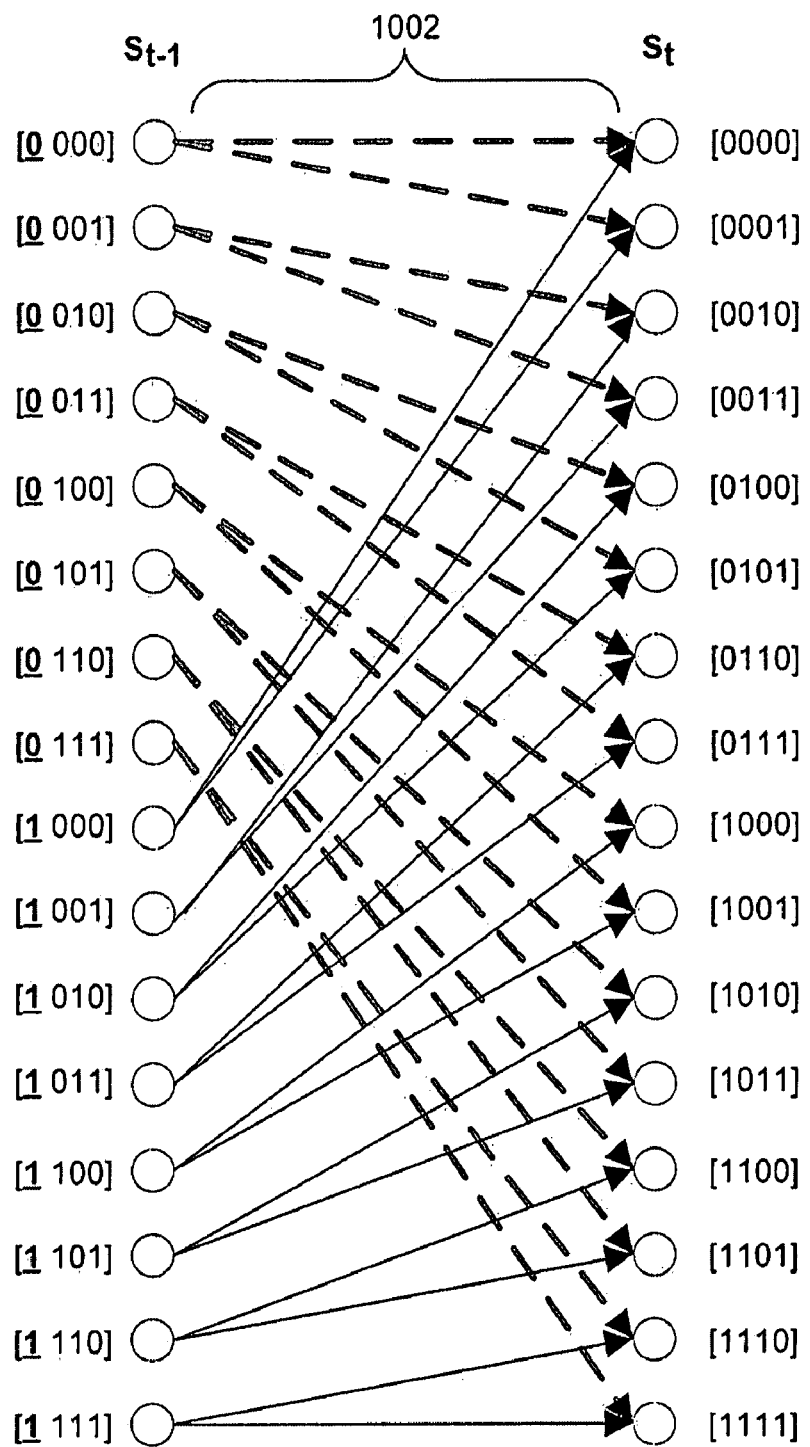
FIG. 10 illustrates branch selection for selective calculation of branch metrics.

Referring now to FIG. 10, a 16-state trellis diagram is shown to illustrate the operation of a detector in accordance with an embodiment of the present invention. Each state of $S_{t-1}$ may represent a particular four-bit sequence. For some detectors (e.g., branch metric computation unit 900), each of the four previous bits in a received signal, which states $S_{t-1}$ are meant to represent, is assumed to be unknown. Thus, no branch in a trellis diagram may be ruled out as an incorrect branch, and a branch metric is computed for each possible branch. In the trellis diagram of FIG. 10, a branch metric would be calculated for each of 32 branches 1002. However, by using a decision from a previous detector, one or more of the previous bits in the received signal may be known (with some degree of confidence) such that only a subset of the 32 branches may be calculated. In the example of FIG. 10, the oldest bit, $X_{-4}$, of $S_{t-1}$ (that is, the most significant bit (MSB) of $S_{t-1}$) may be set to the determined value for that bit from the previous detector. For instance, the previous detector may determine that $X_{-4}=1$. Thus, only branch metrics for branches leading away from states $S_{t-1}$ where $X_{-4}=1$ may be computed. This corresponds to the 16 branches indicated in solid lines. If on the other hand $X_{-4}=0$, then only branch metrics for the branches with dotted lines would be computed.

Figure 10A:
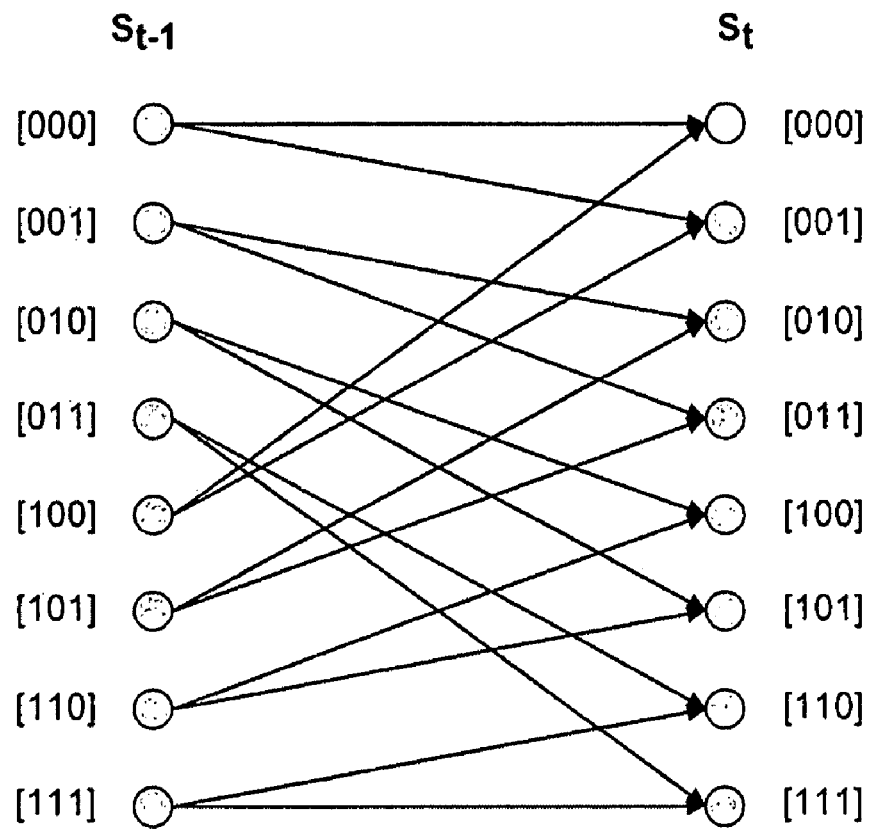
FIG. 10A shows an illustrative 8-state trellis diagram used by an add-compare-select unit.

Although only 16 branch metrics are computed by the detector, these 16 branch metrics may have approximately the resolution and accuracy associated with 16-state trellises rather than 8-state trellises. In particular, they may be processed to counteract signal-dependent noise based on the previous four symbol periods rather than the previous three. These high-resolution 16 branch metrics may then be used in an 8-state ACS unit (e.g., ACS unit 604 of FIG. 6). The 8-state ACS unit may correspond to the trellis illustrated in FIG. 10A. At least because (1) the branch metrics may be calculated with relatively high precision and (2) the branch metric associated with the actual transmitted sequence is likely to be among those that are calculated, a detector that computes 16 branch metrics instead of 32 may not suffer from a substantial decrease in detection performance. In particular, rather than directly reducing the trellis of a detector from 16 states to eight, which would decrease detection performance, the detector effectively works with a portion of a 16-state trellis that is likely to contain the true path (e.g., with either the top half or the bottom half), yet with the complexity that is equivalent to a 8-state detector. Thus, the performance of the detector may be substantially equivalent to a 16-state trellis, not an 8-state trellis.

Figure 11:
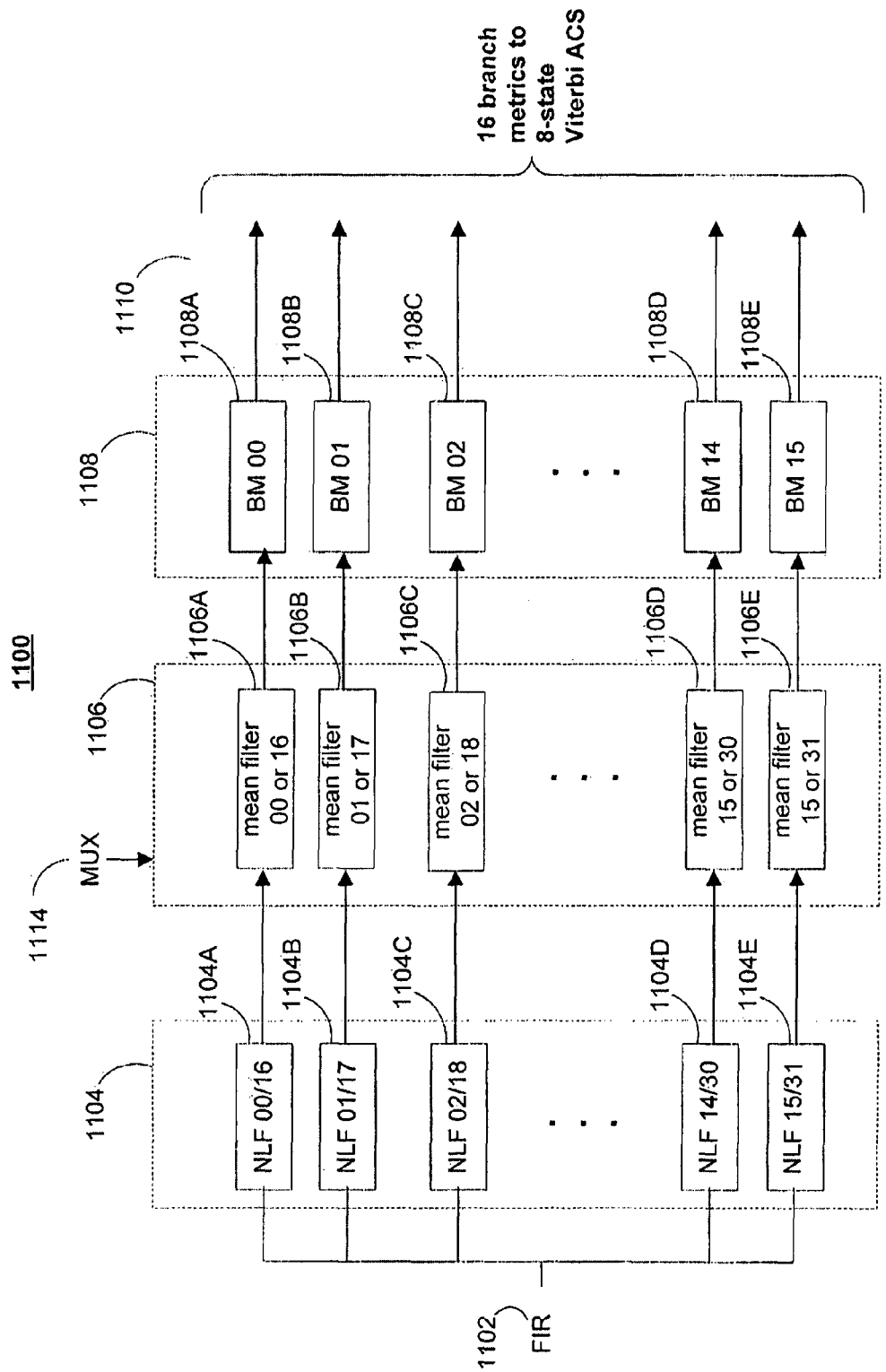
FIG. 11 shows an embodiment of a branch metric computation unit similar to the block diagram of FIG. 8.

Referring now to FIG. 11, illustrative branch metric (BM) computation unit 1100 is shown that may calculate branch metrics as described above in connection with FIG. 10. Thus, as described above, although only BM computation unit 1100 only computes 16 branch metrics, BM computation unit 1100 may have similar performance to a full 16-state trellis detector (e.g., BM computation unit 900 of FIG. 9) that computes 32 branch metrics. As shown in FIG. 11, to reduce complexity, size, and/or power consumption, BM computation unit 1100 may compute only 16 branch metrics at output 1110.

BM computation unit 1100 preferably includes nonlinear filtering unit 1104, mean filtering unit 1106, and computation unit 1108. Nonlinear filtering unit 1104 may be the same or similar to nonlinear filtering unit 904 of FIG. 9. In particular, nonlinear filtering unit 1104 preferably includes 32 or fewer nonlinear filters 1104A-1104E that preferably operates substantially concurrently on input FIR signal 1102, where each nonlinear filter is associated with a particular branch or state in a 16-state trellis diagram. Thus, each of the nonlinear filters in unit 1104 may effectively process signal-dependent noise. Although 32 nonlinear filters are shown in nonlinear filtering unit 1104, a different number of nonlinear filters may be used for a different sized trellis diagram (e.g., 16 NLFs for an eight-state trellis, 64 NLFs for a 32-state trellis, etc.).

Mean filtering unit 1106 preferably removes the mean, or the expected value, of the filtered signals received from nonlinear filtering unit 1104. Mean filtering unit 1106 may include up to 16 mean filters 1106A-1106E—one for each of the branch metrics that are to be calculated. Each mean filter in unit 1106 may also be associated with up to two NLFs in nonlinear filtering unit 1104. In the embodiment shown in FIG. 11, each mean filter in unit 1106 may be associated with two possible branches. For example, mean filter 1106A may be associated with both a [0000]→[0000] branch and a [1000]→[0000] branch. The filtering performed by mean filter 1106A may be chosen based on the decision from a previous detector. That is, if a previous detector determines that the MSB should be a '0,' mean filter 1106A may remove the signal mean assuming the [0000]→[0000] branch. If the previous detector determines that the MSB should be a '1,' mean filter 1106A may remove the signal mean assuming the [1000]→>[0000] branch. A similar selection may be performed by the other 15 mean filters in mean filtering unit 1106. These branch selections performed by mean filtering unit 1106 may be based on the value of MUX select 1114, the value of which may be derived from the output of the previous detector. In some embodiments, if each mean filter unit is associated with more than one NLF in nonlinear filtering unit 1106, a mean filter may choose one of the filtered signals from unit 1106 based on MUX select 1114. Although 16 filters are shown in mean filtering unit 1106, a different number of filters may be used for a different sized trellis diagram (e.g., eight filters for an eight-state trellis, 32 filters for a 32-state trellis, etc.).

Mean filtering unit 1106 preferably outputs 16 zero-mean, filtered signals. These outputs preferably are then processed by computation unit 1108. Computation unit 1108 may include 16 subunits that may compute branch metrics, each of which is preferably associated with a mean filter from mean filtering unit 1106. Thus, the 16 branch metrics computed by the 16 subunits may correspond to the branches chosen by MUX value 1114 from a previous detector. Although 16 subunits are shown in computation unit 1108, a different number of subunits may be used for a different sized trellis diagram (e.g., eight subunits for an eight-state trellis, 32 subunits for a 32-state trellis, etc.).

Using the 16 branch metrics provided by computation unit 1108 of FIG. 11, an eight-state Viterbi ACS unit (e.g., ACS unit 604 of FIG. 6) may be used to select winning branches, and to determine the most likely path through the trellis. Although an eight-state ACS unit is used, for at least the reasons given above in connection with FIG. 10, the performance of the detector may be substantially equivalent to the performance of a 16-state ACS unit. Thus, a detector that uses branch metric computation unit 1100 may have similar performance to a detector that uses branch metric computation unit 900 of FIG. 9 even though fewer total branch metrics may be calculated. Moreover, not only is the complexity of the ACS unit reduced from 16-state to 8-state, BM computation unit 1100 preferably has half the number of mean filters and half the number of computation subunits than BM computation unit 900. Therefore, BM computation unit 1100 preferably uses substantially half the area, complexity, and/or power consumption than BM computation unit 900.

In the illustration of FIG. 10 and the embodiment of a BM computation unit shown in FIG. 11, one bit corresponding to the state MSB is used from a previous detector. In other embodiments of the present invention, multiple bits may be used to further reduce the complexity of the detector. For example, a detector that uses BM computation unit 1100 may utilize two bits from a previous detector. With only two remaining bits that can vary, only eight branch metrics may be calculated, and a four-state Viterbi ACS may be used. BM computation unit 1100 of FIG. 11 may be altered to reflect this embodiment. In particular, mean filtering unit 1106 may include eight mean filters, each of which may be associated with four different branches, and may output eight filtered, zero-mean signals. For example, one of the mean filters may be associated with the branches associated with sequences "00000," "01000," "10000," and "11000," and may select a particular sequence based on the two bits obtained from the previous detector. Similarly, computation unit 1108 may include eight subunits, and may produce a total of eight branch metrics from the eight filtered, zero-mean signals. Thus, it should be understood that, not only may a trellis be of any size, any suitable number of bits may be borrowed from a previous detector.

The embodiments of BM computation unit 1100 of FIG. 11 thus described have used the oldest bits (that is, the MSBs) from previous detectors. It should be understood that a detector may utilize any information from a previous detector, including the most recent bit, the most recent N bits, or any other suitable pattern of bits (e.g., the LSB and the MSB, etc.).

The present invention may also be used to increase the number of nonlinear filters in a detector without significantly increasing the complexity or area of the remaining components. In particular, for channels with a large number of taps, it may be beneficial to increase the number of nonlinear filters to support filtering for longer sequences. With a BM computation unit similar to BM computation unit 900 of FIG. 9, increasing the number of nonlinear filters may necessitate an increase in the number of mean filters and computation subunits, as well as an increase in the states of a following ACS unit. However, by using BM computation unit 1100 of FIG. 11, the number of nonlinear filters may be increased to support longer sequences, yet the number and complexity of the remaining components (e.g., mean filters, computation subunits, ACS states), may remain the same or even be reduced.

Figure 12:
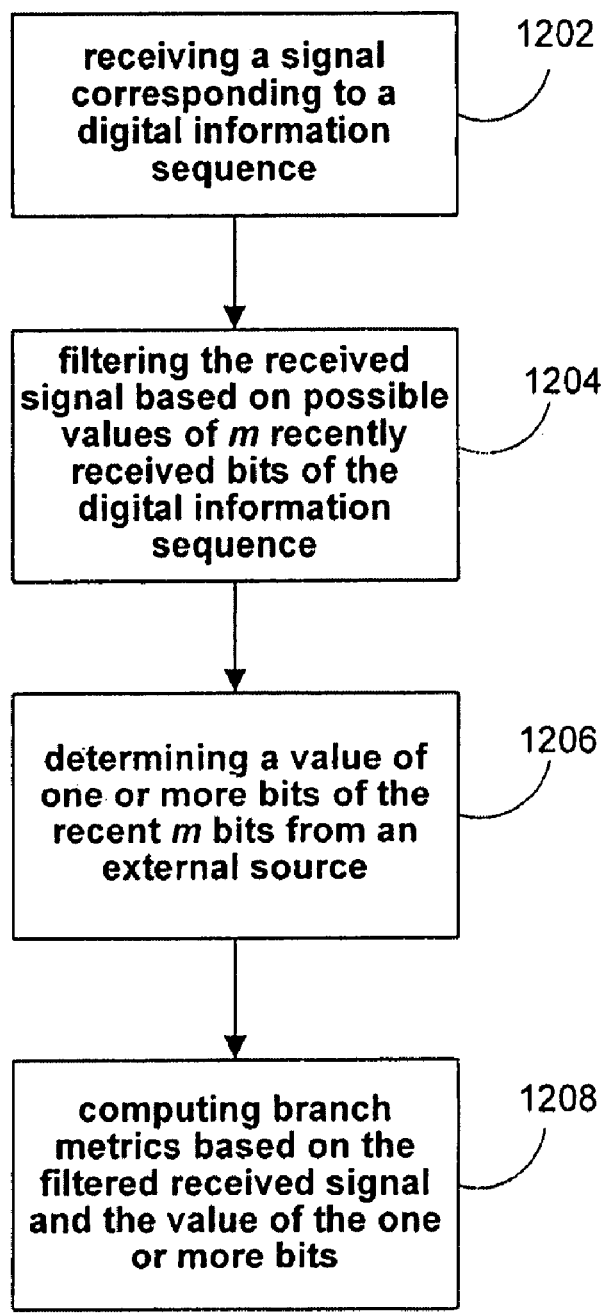
FIG. 12 shows an illustrate flow diagram for computing branch metrics.

Referring now to FIG. 12, illustrative flow diagram 1200 is shown for calculating branch metrics in accordance with an aspect of the present invention. At step 1202, a signal that corresponds to a digital information sequence may be received. The signal may be received from a channel (e.g., channel 108 of FIG. 1) that can distort the digital information that was originally transmitted. The channel may correspond to a digital communications or digital storage system.

The received signal may then be filtered at step 1204. The received signal may be filtered by a finite impulse response (FIR) filter (e.g., FIR filter 314 of FIG. 3) that may, for example, reduce the effects of white noise. The received signal may also be filtered by nonlinear filters. The nonlinear filters may filter the received signal, or a FIR-filtered version of the received signal, based on possible values of recently received bits of the digital information sequence. The received signal may be filtered based on past bits to combat signal-dependent noise. In particular, the received signal may be filtered for signal-dependent noise by separately filtering the received signal for the different possible values of the recently received bits (e.g., filtering the signal assuming a "00000" sequence and separately filtering the signal assuming a "11111" sequence). Thus, the received signal may be separately filtered a plurality of times for different possible values of m recent bits. The variable, m, may be chosen based on the number of taps of the channel that the signal was received from. For example, for a five-tap channel, the received signal may be filtered separately for each possible five-bit (m=4) sequence.

After filtering the received signal for signal-dependent noise, the value of one or more bits of the m recent bits may be determined at step 1206. The one or more bits may be determined from an external source. In particular, the one or more bits may be determined from an estimate of the digital information sequence for those one or more bits determined by another Viterbi detector.

At step 1208, branch metrics may be calculated based on the filtered received signal and the determined value of the one or more bits of the digital information sequence. In particular, branch metrics for trellis branches that correspond to the determined value of the one or more branches may be computed. These branches may be computed from the plurality of filtered signals obtained in step 1204. In particular, a branch metric for a branch may be calculated from the filtered signal with the associated signal dependency. That is, a branch metric for a [0000]→[0000] branch may be computed from a filtered signal that was filtered assuming the noise associated with a [0000]→[0000] branch. Computing branch metrics may involve additionally filtering at least a subset of the plurality of filtered signals to remove their means. Calculating branch metrics at step 1208 may also involve computing at least part of the equation, $$BM = \frac{\left(\sum_{i=0}^{L} f_{i,b} Y_{t-i} - \sum_{i=0}^{L} f_{i,b} \hat{Y}_{t-i,b}\right)^2}{2\sigma_b^2} + \frac{1}{2}\log(2\pi\sigma_b^2)$$

for the remaining branches.

Flow diagram 1200 of FIG. 12 is merely illustrative. Any of the steps in flow diagram 1200 may be omitted, modified, or rearranged, and any additional steps may be added without leaving the scope of the invention.

Referring now to FIGS. 13A-13G, various exemplary implementations of the present invention are shown.

Figure 13A:
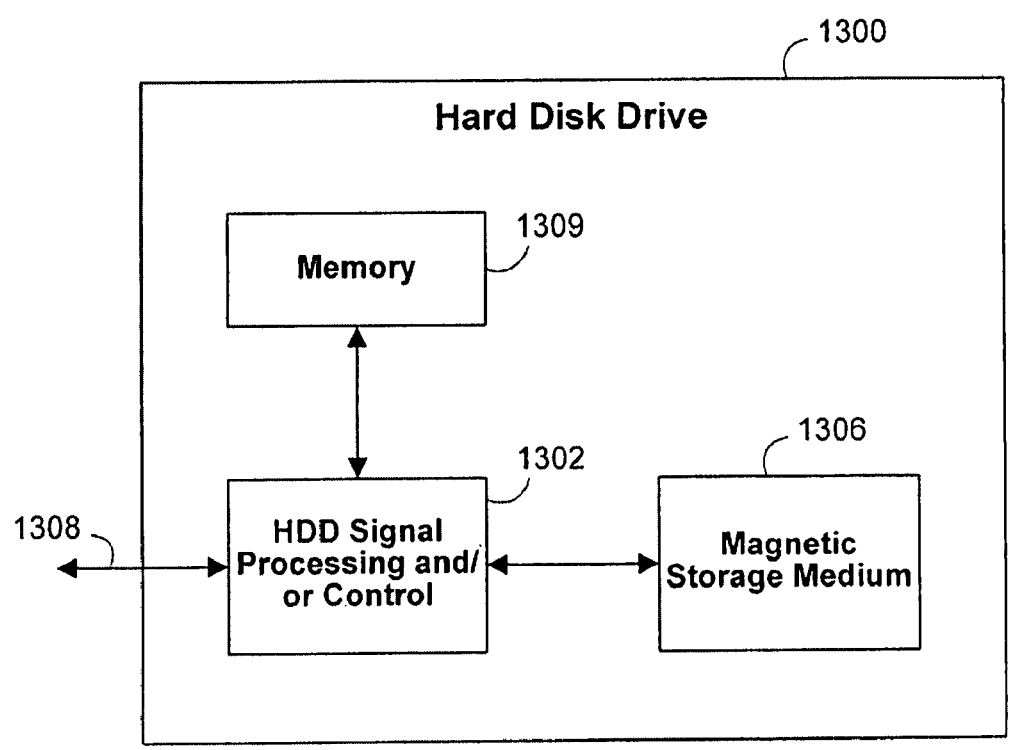
FIG. 13A is a block diagram of an exemplary hard disk drive that can employ the disclosed technology.

Referring now to FIG. 13A, the present invention can be implemented in a hard disk drive 1300. The present invention may implement either or both signal processing and/or control circuits, which are generally identified in FIG. 13A at 1302. In some implementations, the signal processing and/or control circuit 1302 and/or other circuits (not shown) in the HDD 1300 may process data, perform coding and/or encryption, perform calculations, and/or format data that is output to and/or received from a magnetic storage medium 1306.

The HDD 1300 may communicate with a host device (not shown) such as a computer, mobile computing devices such as personal digital assistants, cellular phones, media or MP3 players and the like, and/or other devices via one or more wired or wireless communication links 1308. The HDD 1300 may be connected to memory 1309 such as random access memory (RAM), low latency nonvolatile memory such as flash memory, read only memory (ROM) and/or other suitable electronic data storage.

Figure 13B:
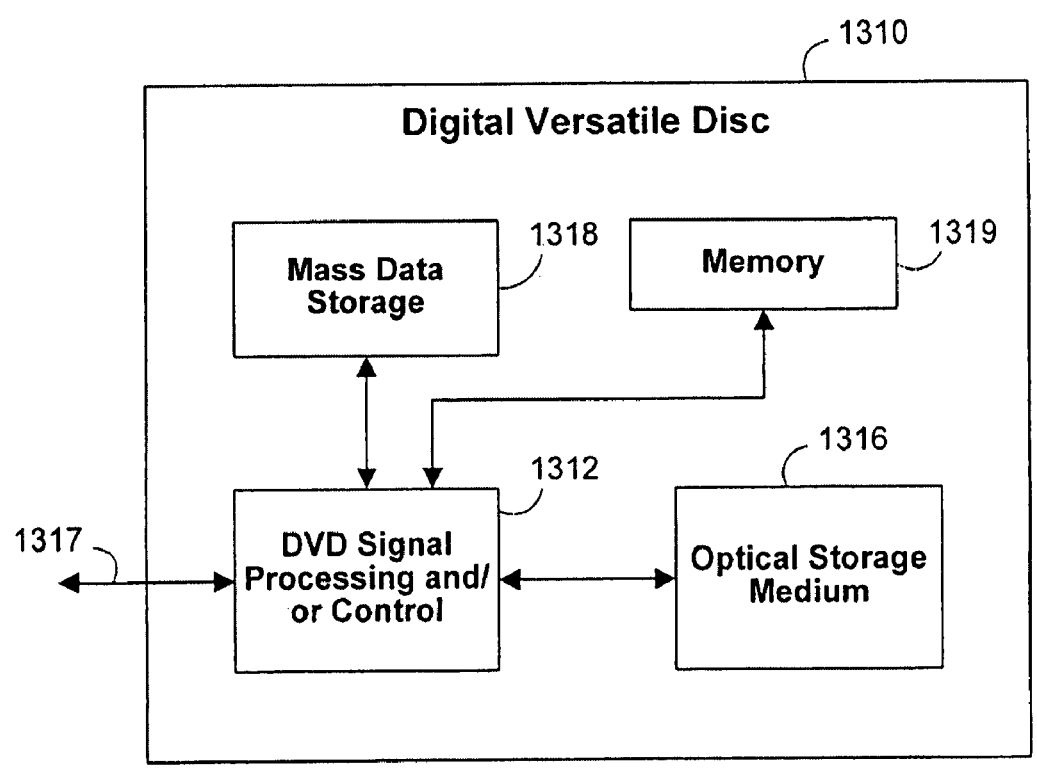
FIG. 13B is a block diagram of an exemplary digital versatile disc that can employ the disclosed technology.

Referring now to FIG. 13B, the present invention can be implemented in a digital versatile disc (DVD) drive 1310. The present invention may implement either or both signal processing and/or control circuits, which are generally identified in FIG. 13B at 1312, and/or mass data storage of the DVD drive 1310. The signal processing and/or control circuit 1312 and/or other circuits (not shown) in the DVD 1310 may process data, perform coding and/or encryption, perform calculations, and/or format data that is read from and/or data written to an optical storage medium 1316. In some implementations, the signal processing and/or control circuit 1312 and/or other circuits (not shown) in the DVD 1310 can also perform other functions such as encoding and/or decoding and/or any other signal processing functions associated with a DVD drive.

The DVD drive 1310 may communicate with an output device (not shown) such as a computer, television or other device via one or more wired or wireless communication links 1317. The DVD 1310 may communicate with mass data storage 1318 that stores data in a nonvolatile manner. The mass data storage 1318 may include a hard disk drive (HDD). The HDD may have the configuration shown in FIG. 13A. The HDD may be a mini HDD that includes one or more platters having a diameter that is smaller than approximately 1.8". The DVD 1310 may be connected to memory 1319 such as RAM, ROM, low latency nonvolatile memory such as flash memory and/or other suitable electronic data storage.

Figure 13C:
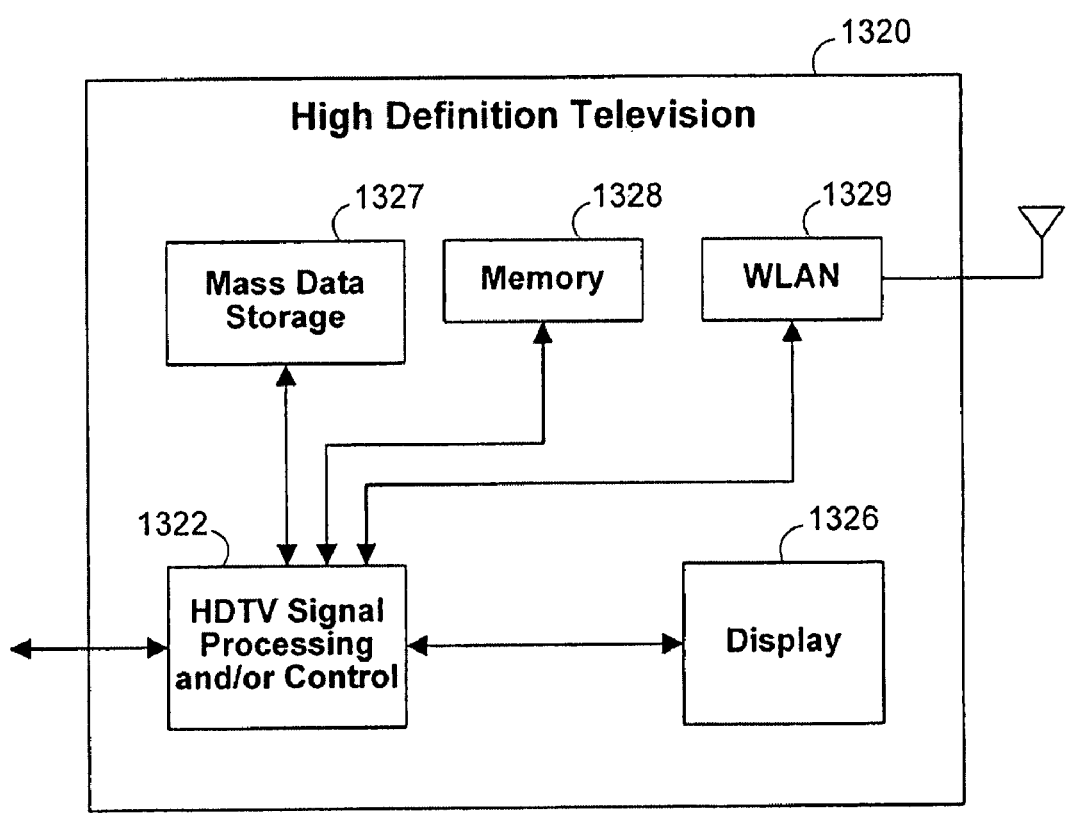
FIG. 13C is a block diagram of an exemplary high definition television that can employ the disclosed technology.

Referring now to FIG. 13C, the present invention can be implemented in a high definition television (HDTV) 1320. The present invention may implement either or both signal processing and/or control circuits, which are generally identified in FIG. 13C at 1322, a WLAN interface and/or mass data storage of the HDTV 1320. The HDTV 1320 receives HDTV input signals in either a wired or wireless format and generates HDTV output signals for a display 1326. In some implementations, signal processing circuit and/or control circuit 1322 and/or other circuits (not shown) of the HDTV 1320 may process data, perform coding and/or encryption, perform calculations, format data and/or perform any other type of HDTV processing that may be required.

The HDTV 1320 may communicate with mass data storage 1327 that stores data in a nonvolatile manner such as optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The HDTV 1320 may be connected to memory 1328 such as RAM, ROM, low latency nonvolatile memory such as flash memory and/or other suitable electronic data storage. The HDTV 1320 also may support connections with a WLAN via a WLAN network interface 1329.

Figure 13D:
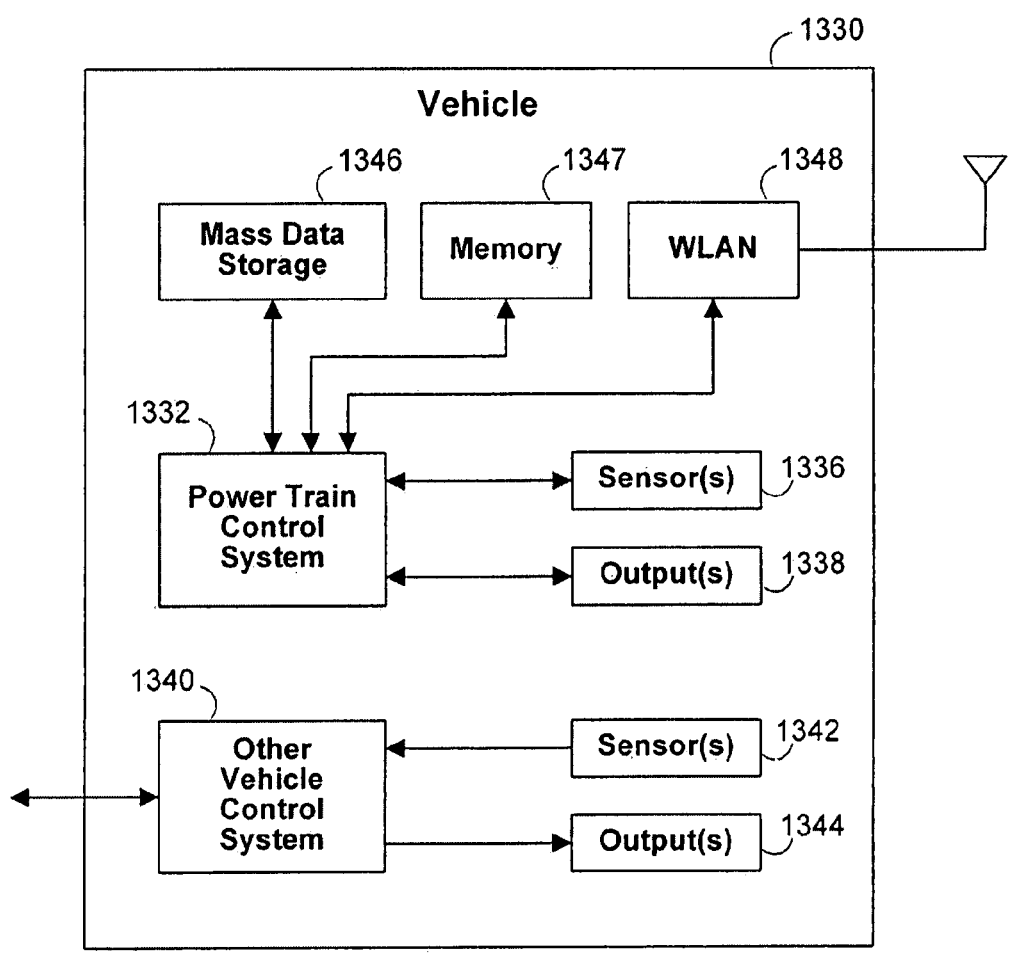
FIG. 13D is a block diagram of an exemplary vehicle that can employ the disclosed technology.

Referring now to FIG. 13D, the present invention implements a control system of a vehicle 1330, a WLAN interface and/or mass data storage of the vehicle control system. In some implementations, the present invention may implement a powertrain control system 1332 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 1340 of the vehicle 1330. The control system 1340 may likewise receive signals from input sensors 1342 and/or output control signals to one or more output devices 1344. In some implementations, the control system 1340 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1332 may communicate with mass data storage 1346 that stores data in a nonvolatile manner. The mass data storage 1046 may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The powertrain control system 1332 may be connected to memory 1347 such as RAM, ROM, low latency nonvolatile memory such as flash memory and/or other suitable electronic data storage. The powertrain control system 1332 also may support connections with a WLAN via a WLAN network interface 1348. The control system 1340 may also include mass data storage, memory and/or a WLAN interface (all not shown).

Figure 13E:
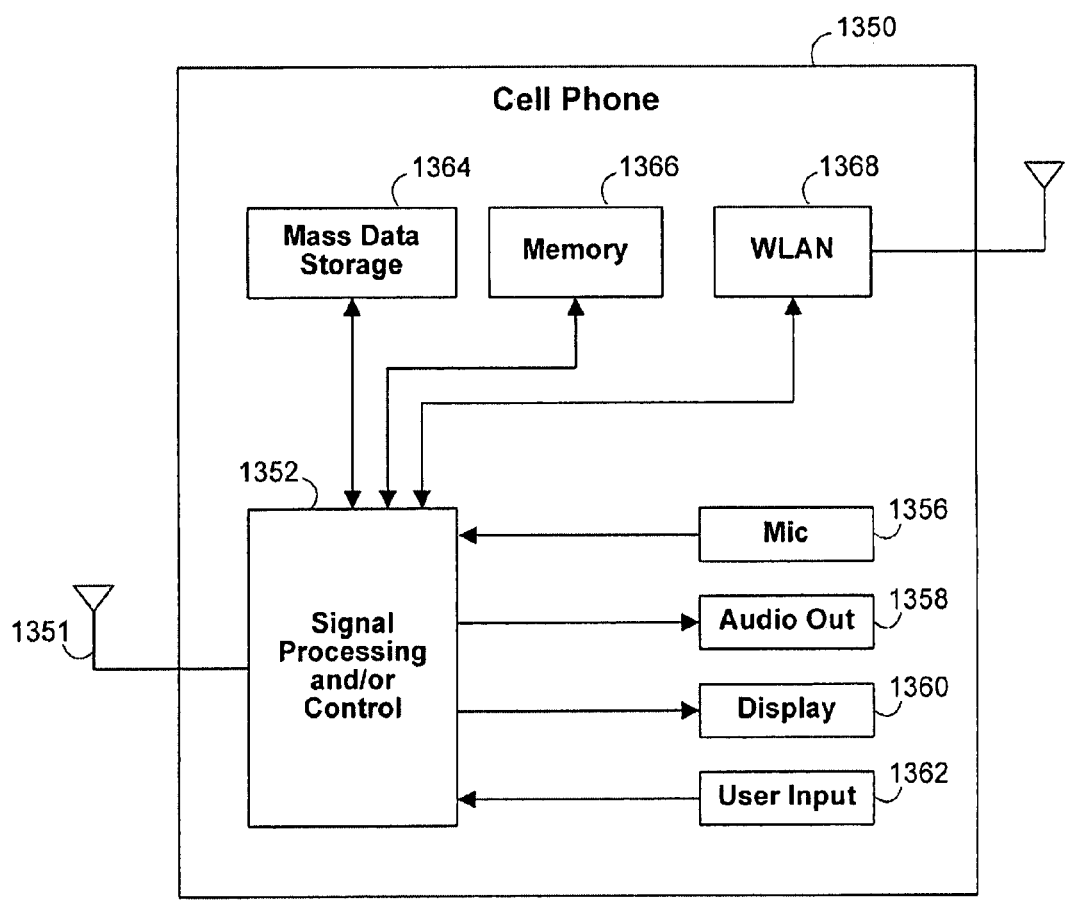
FIG. 13E is a block diagram of an exemplary cell phone that can employ the disclosed technology.

Referring now to FIG. 13E, the present invention can be implemented in a cellular phone 1350 that may include a cellular antenna 1351. The present invention may implement either or both signal processing and/or control circuits, which are generally identified in FIG. 13E at 1352, a WLAN interface and/or mass data storage of the cellular phone 1350. In some implementations, the cellular phone 1350 includes a microphone 1356, an audio output 1358 such as a speaker and/or audio output jack, a display 1360 and/or an input device 1362 such as a keypad, pointing device, voice actuation and/or other input device. The signal processing and/or control circuits 1352 and/or other circuits (not shown) in the cellular phone 1350 may process data, perform coding and/or encryption, perform calculations, format data and/or perform other cellular phone functions.

The cellular phone 1350 may communicate with mass data storage 1364 that stores data in a nonvolatile manner such as optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The cellular phone 1350 may be connected to memory 1366 such as RAM, ROM, low latency nonvolatile memory such as flash memory and/or other suitable electronic data storage. The cellular phone 1350 also may support connections with a WLAN via a WLAN network interface 1368.

Figure 13F:
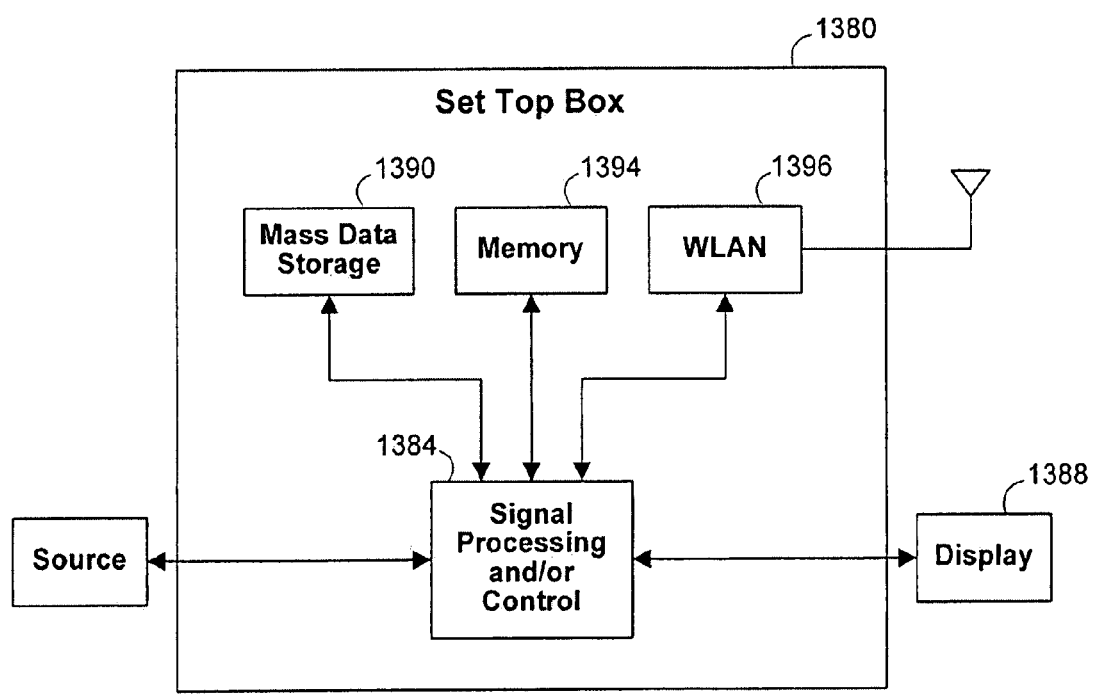
FIG. 13F is a block diagram of an exemplary set top box that can employ the disclosed technology.

Referring now to FIG. 13F, the present invention can be implemented in a set top box 1380. The present invention may implement either or both signal processing and/or control circuits, which are generally identified in FIG. 13F at 1384, a WLAN interface and/or mass data storage of the set top box 1380. The set top box 1380 receives signals from a source such as a broadband source and outputs standard and/or high definition audio/video signals suitable for a display 1388 such as a television and/or monitor and/or other video and/or audio output devices. The signal processing and/or control circuits 1384 and/or other circuits (not shown) of the set top box 1380 may process data, perform coding and/or encryption, perform calculations, format data and/or perform any other set top box function.

The set top box 1380 may communicate with mass data storage 1390 that stores data in a nonvolatile manner. The mass data storage 1390 may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The set top box 1380 may be connected to memory 1394 such as RAM, ROM, low latency nonvolatile memory such as flash memory and/or other suitable electronic data storage. The set top box 1380 also may support connections with a WLAN via a WLAN network interface 1396.

Figure 13G:
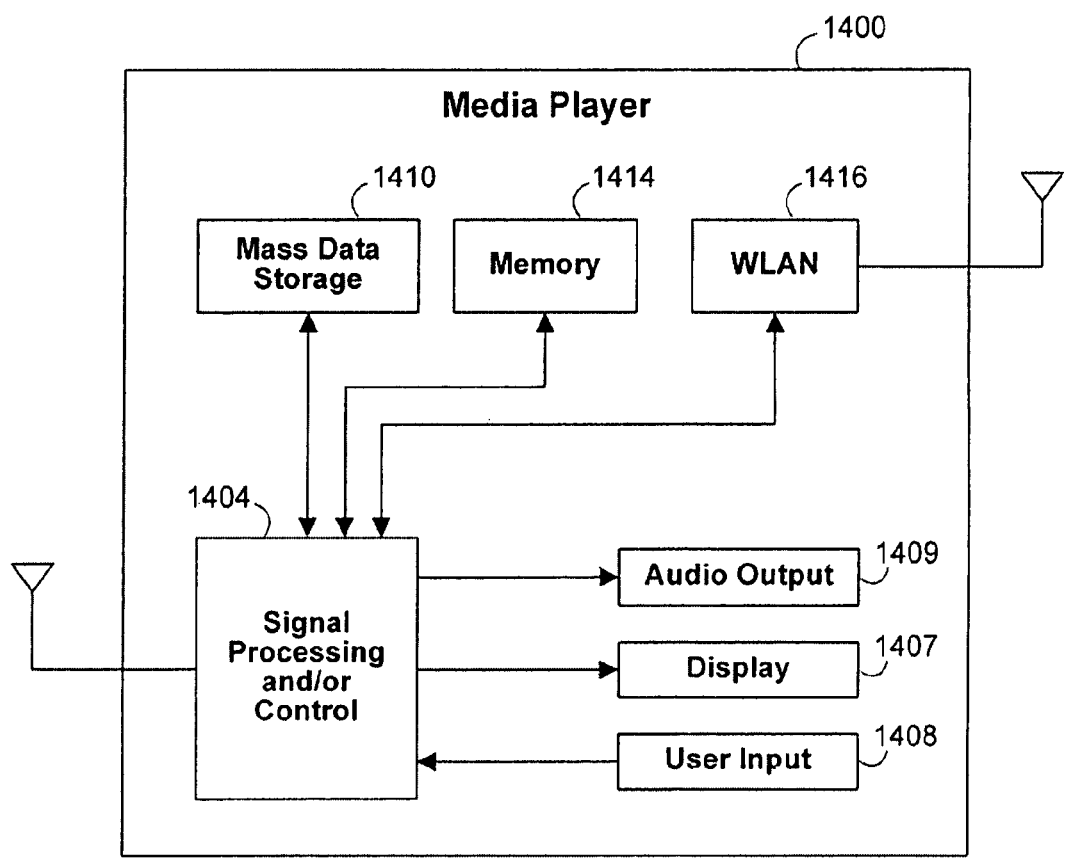
FIG. 13G is a block diagram of an exemplary media player that can employ the disclosed technology.

Referring now to FIG. 13G, the present invention can be implemented in a media player 1460. The present invention may implement either or both signal processing and/or control circuits, which are generally identified in FIG. 13G at 1404, a WLAN interface and/or mass data storage of the media player 1400. In some implementations, the media player 1400 includes a display 1407 and/or a user input 1408 such as a keypad, touchpad and the like. In some implementations, the media player 1400 may employ a graphical user interface (GUI) that typically employs menus, drop down menus, icons and/or a point-and-click interface via the display 1407 and/or user input 1408. The media player 1400 further includes an audio output 1409 such as a speaker and/or audio output jack. The signal processing and/or control circuits 1404 and/or other circuits (not shown) of the media player 1400 may process data, perform coding and/or encryption, perform calculations, format data and/or perform any other media player function.

The media player 1400 may communicate with mass data storage 1410 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 13A and/or at least one DVD may have the configuration shown in FIG. 13B. The HDD may be a mini HDD that includes one or more platters having a diameter that is smaller than approximately 1.8". The media player 1400 may be connected to memory 1414 such as RAM, ROM, low latency nonvolatile memory such as flash memory and/or other suitable electronic data storage. The media player 1400 also may support connections with a WLAN via a WLAN network interface 1416. Still other implementations in addition to those described above are contemplated.

The foregoing describes systems and methods for providing a nonlinear Viterbi detector that can utilize decisions from other Viterbi detectors. Those skilled in the art will appreciate that the invention can be practiced by other than the described embodiments, which are presented for the purpose of illustration rather than of limitation.

What is claimed is:

1. A method of decoding a current symbol of a digital information sequence for a first time, comprising:
    processing, for a first time, a current symbol of the digital information sequence simultaneously at each of a decoder and an estimator, wherein:
        the decoder is coupled to the estimator; and
        the processing comprises:
            obtaining, at the decoder, an estimate of a previously processed symbol of the digital information sequence from the estimator;
            selecting, at the decoder, a subset of branches in a first state-based diagram based on the estimate of the previously processed symbol;
            calculating branch metrics corresponding to the subset of branches in the first state-based diagram; and
            decoding, at the decoder, the current symbol of the digital information sequence based on the calculated branch metrics, wherein the decoding occurs while the estimator processes the current symbol for the first time.

2. The method of claim 1 wherein the first state-based diagram is a trellis diagram, and wherein the decoder is a Viterbi detector.

3. The method of claim 1 wherein the estimate of the previously processed symbol is derived from an NRZ signal representation of a part of the digital information sequence.

4. The method of claim 1 wherein the subset of branches comprises branches leading away from states in the first state-based diagram that have values corresponding to the estimate of the previously presented symbol.

5. The method of claim 1, further comprising receiving a signal from a digital communications or digital storage system, wherein the received signal is a noisy representation of the digital information sequence.

6. The method of claim 5 wherein the current symbol corresponds to more recently received information in the received signal than the previously processed symbol.

7. The method of claim 5 wherein calculating branch metrics comprises processing the received signal separately for each branch in the first state-based diagram that corresponds to the estimate of the previously processed symbol.

8. The method of claim 7, wherein processing the received signal separately comprises filtering the received signal to whiten signal-dependent noise.

9. The method of claim 7, further comprising providing the branch metrics to an add-compare-select unit, wherein the add-compare-select unit is associated with a second state-based diagram having fewer states than the first state-based diagram.

10. The method of claim 9 wherein the first state-based diagram is a 16-state diagram and the second state-based diagram is a 8-state diagram.

11. A method of decoding a current symbol of a digital information sequence for a first time, comprising:
    receiving, at a decoder and an estimator, a signal corresponding to the digital information sequence;
    filtering, by the decoder, the received signal based on possible values of a predetermined number of recently received bits of the digital information sequence, wherein each of the recently received bits is received prior to receiving the current symbol;
    determining, by the decoder, a value of one or more bits of the recently received bits;
    calculating a plurality of branch metrics based on the filtered received signal and the value of the one or more bits; and
    decoding, by the decoder, the current symbol of the digital information sequence based on the plurality of branch metrics, wherein the decoding occurs while the estimator processes the current symbol for the first time.

12. The method of claim 11 wherein filtering the received signal comprises separately filtering the received signal for different possible values of the predetermined number of recently received bits to obtain a plurality of filtered signals.

13. The method of claim 12 wherein separately filtering the received signal comprises whitening noise in the received signal that depends on the value of the predetermined number of recently received bits.

14. The method of claim 12 further comprising processing the plurality of filtered signals based on the determined value of the one or more bits.

15. The method of claim 14 wherein processing the plurality of filtered signals comprises, for each signal in the plurality of filtered signals, determining a mean signal value of the signal, and removing the mean signal value from the signal.

16. The method of claim 11 wherein determining the value of the one or more bits comprises obtaining detection decisions from the estimator.

17. The method of claim 11 wherein the one or more bits are chosen from most significant bits of the predetermined number of recently received bits.

18. The method of claim 11 further comprising filtering the received signal with an finite impulse response (FIR) filter.

19. The method of claim 11 wherein calculating the plurality of branch metrics comprises using the filtered received signal to calculate branch metrics for branches corresponding to the determined value of the one or more bits.

20. The method of claim 11 wherein calculating the plurality of branch metrics comprises computing $$BM = \frac{\left(\sum_{i=0}^{L} f_{i,b} Y_{t-i} - \sum_{i=0}^{L} f_{i,b} \hat{Y}_{t-i,b}\right)^2}{2\sigma_b^2} + \frac{1}{2}\log(2\pi\sigma_b^2)$$

for each branch that corresponds to the value of the one or more bits, where $\hat{Y}_{t,b}$ is an expected signal for a given branch b, Y is a processed received signal, $f_{i,b}$ is a coefficient of a signal-dependent noise-whitening filter for the given branch b, L is a number of coefficients of the signal-dependent noise-whitening filter, and $\sigma^2$ is a variance of noise.

21. Apparatus for decoding a current symbol of a digital information sequence for a first time, comprising:
means for obtaining, at a decoder, an estimate of a previously processed symbol of the digital information sequence from an estimator coupled to the-decoder;
means for selecting, at the decoder, a subset of branches in a first state-based diagram based on the estimate of the previously processed symbol;
means for calculating branch metrics corresponding to the subset of branches in the first state-based diagram; and
decoding, at the decoder, the current symbol of the digital information sequence based on the calculated branch metrics, wherein the decoding occurs while the estimator processes the current symbol for the first time.

22. The apparatus of claim 21 wherein the first state-based diagram is a trellis diagram, and wherein the decoder is a Viterbi detector.

23. The apparatus of claim 21 wherein the estimate of the previously processed symbol is derived from an NRZ signal representation of a part of the digital information sequence.

24. The apparatus of claim 21 wherein the subset of branches comprises branches leading away from states in the first state-based diagram that have values corresponding to the estimate of the previously processed symbol.

25. The apparatus of claim 21, further comprising means for receiving a signal from a digital communications or digital storage system, wherein the received signal is a noisy representation of the digital information sequence.

26. The apparatus of claim 25 wherein the current symbol corresponds to more recently received information in the received signal than the previously processed symbol.

27. The apparatus of claim 25 wherein the means for calculating branch metrics comprises means for processing the received signal separately for each branch in the first state-based diagram that corresponds to the estimate of the previously processed symbol.

28. The apparatus of claim 27, wherein the means for processing the received signal separately comprises means for filtering the received signal to whiten signal-dependent noise.

29. The apparatus of claim 27, further comprising means for providing the branch metrics to an add-compare-select unit, wherein the add-compare-select unit is associated with a second state-based diagram having fewer states than the first state-based diagram.

30. The apparatus of claim 29 wherein the first state-based diagram is a 16-state diagram and the second state-based diagram is a 8-state diagram.

31. Apparatus for decoding a current symbol of a digital information sequence for a first time, comprising:
means for receiving, at a decoder and an estimator, a signal corresponding to the digital information sequence;
means for filtering the received signal based on possible values of a predetermined number of recently received bits of the digital information sequence, wherein each of the recently received bits is received prior to receiving the current symbol;
means for determining a value of one or more bits of the recently received bits;
means for calculating a plurality of branch metrics based on the filtered received signal and the value of the one or more bits; and
means for decoding the current symbol of the digital information sequence based on the plurality of branch metrics, wherein the decoding occurs while the estimator processes the current symbol for the first time.

32. The apparatus of claim 31 wherein the means for filtering the received signal comprises means for separately filtering the received signal for different possible values of the predetermined number of recently received bits to obtain a plurality of filtered signals.

33. The apparatus of claim 32 wherein the means for separately filtering the received signal comprises means for whitening noise in the received signal that depends on the value of the predetermined number of recently received bits.

34. The apparatus of claim 32 further comprising means for processing the plurality of filtered signals based on the determined value of the one or more bits.

35. The apparatus of claim 34 wherein the means for processing the plurality of filtered signals comprises, for each signal in the plurality of filtered signals, determining a mean signal value of the signal, and removing the mean signal value from the signal.

36. The apparatus of claim 31 wherein the means for determining the value of the one or more bits comprises means for obtaining detection decisions from the estimator.

37. The apparatus of claim 31 wherein the one or more bits are chosen from most significant bits of the predetermined number of recently received bits.

38. The apparatus of claim 31 further comprising means for filtering the received signal with an finite impulse response (FIR) filter.

39. The apparatus of claim 31 wherein the means for calculating the plurality of branch metrics comprises means for using the filtered received signal to calculate branch metrics for branches corresponding to the determined value of the one or more bits.

40. The apparatus of claim 31 wherein the means for calculating the plurality of branch metrics comprises means for computing $$BM = \frac{\left(\sum_{i=0}^{L} f_{i,b} Y_{t-i} - \sum_{i=0}^{L} f_{i,b} \hat{Y}_{t-i,b}\right)^2}{2\sigma_b^2} + \frac{1}{2}\log(2\pi\sigma_b^2)$$

for each branch that corresponds to the value of the one or more bits, where $\hat{Y}_{t,b}$ is an expected signal for a given branch b, Y is a processed received signal, $f_{i,b}$ is a coefficient of a signal-dependent noise-whitening filter for the given branch b, L is a number of coefficients of the signal-dependent noise-whitening filter, and $\sigma^2$ is a variance of noise.

41. A branch metric computation unit for decoding a current symbol of a digital information sequence for a first time, comprising:
an input circuit for obtaining, at a decoder, an estimate of a previously processed symbol of the digital information sequence from an estimator coupled to the decoder;
a selection circuit for selecting, at the decoder, a subset of branches in a first state-based diagram based on the estimate of the previously processed symbol;
a computation circuit for calculating branch metrics corresponding to the subset of branches in the first state-based diagram; and
a decoding circuit for decoding, at the decoder, the current symbol of the digital information sequence based on the calculated branch metrics, wherein the decoding occurs while the estimator processes the current symbol for the first time.

42. The branch metric computation unit of claim 41 wherein the first state-based diagram is a trellis diagram, and wherein the decoder is a Viterbi detector.

43. The branch metric computation unit of claim 41 wherein the estimate of the previously processed symbol is derived from an NRZ signal representation of a part of the digital information sequence.

44. The branch metric computation unit of claim 41 wherein the subset of branches comprises branches leading away from states of the first state-based diagram that have values corresponding to the estimate of the previously processed symbol.

45. The branch metric computation unit of claim 41, further comprising a receiver for receiving a signal from a digital communications or digital storage system, wherein the received signal is a noisy representation of the digital information sequence.

46. The branch metric computation unit of claim 45 wherein the current symbol corresponds to more recently received information in the received signal than the previously processed symbol.

47. The branch metric computation unit of claim 45 wherein the computation unit comprises a plurality of filters for separately processing the received signal for each branch in the first state-based diagram that corresponds to the estimate of the previously processed symbol.

48. The branch metric computation unit of claim 47, wherein the plurality of filters comprise noise-whitening filters that whiten signal-dependent noise.

49. A Viterbi detector having the branch metric computation unit defined in claim 47, the Viterbi detector further comprising an add-compare-select unit for selecting paths through a second state-based diagram based on the branch metrics calculated by the branch metric computation unit, wherein the second state-based diagram has fewer states than the first state-based diagram.

50. The Viterbi detector of claim 49, wherein the first state-based diagram is a 16-state diagram and the second state-based diagram is an 8-state diagram.

51. An iterative decoding system having the Viterbi detector defined in claim 49 and the estimator coupled to an input of the Viterbi detector.

52. The iterative decoding system of claim 51 wherein the Viterbi detector outputs soft information, the iterative decoding system further comprising an error correcting decoder for decoding the soft information.

53. A branch metric computation unit for decoding a current symbol of a digital information sequence for a first time, comprising:
a first receiver located at a decoder for receiving a signal corresponding to the digital information sequence;
a second receiver located at an estimator for receiving the signal;
a nonlinear filtering unit located at the decoder for filtering the received signal based on possible values of a predetermined number of recently received bits of the digital information sequence, wherein each of the recently received bits is received prior to receiving the current symbol;
an input selection circuit located at the decoder for obtaining a value of one or more bits of the recently received bits;
a computation unit for calculating a plurality of branch metrics based on the filtered received signal and the value of the one or more bits; and
a decoding unit located at the decoder for decoding the current symbol of the digital information sequence based on the plurality of branch metrics, wherein the decoding occurs while the estimator processes the current symbol for the first time.

54. The branch metric computation unit of claim 53 wherein the nonlinear filtering unit comprises a plurality of filters that output a plurality of filtered signals, wherein the separate filters separately filter the received signal for different possible values of the predetermined number of recently received bits.

55. The branch metric computation unit of claim 54 wherein the plurality of filters comprise noise-whitening filters that whiten noise in the received signal depending on the predetermined number of recently received bits.

56. The branch metric computation unit of claim 54 further comprising a mean filtering unit for processing the plurality of filtered signals based on the value of the one or more bits.

57. The branch metric computation unit of claim 56 wherein the mean filtering unit comprises:
a mean determination unit for determining, for each signal in the plurality of filtered signals, a corresponding mean signal value; and
a plurality of mean filters for removing, from each signal in the plurality of filtered signals, the corresponding determined mean signal value.

58. The branch metric computation unit of claim 53 wherein the input selection circuit obtains detection decisions from the estimator.

59. The branch metric computation unit of claim 53 wherein the one or more bits are chosen from most significant bits of the predetermined number of recently received bits.

60. The branch metric computation unit of claim 53 further comprising a finite impulse response (FIR) filter for filtering the received signal.

61. The branch metric computation unit of claim 53 wherein the computation unit comprises a plurality of computation subunits for calculating branch metrics for branches corresponding to the determined value of the one or more bits.

62. The branch metric computation unit of claim 53 wherein the computation unit outputs branch metrics according to $$BM = \frac{\left(\sum_{i=0}^{L} f_{i,b} Y_{t-i} - \sum_{i=0}^{L} f_{i,b} \hat{Y}_{t-i,b}\right)^2}{2\sigma_b^2} + \frac{1}{2}\log(2\pi\sigma_b^2)$$

for each branch that corresponds to the value of the one or more bits, where $\hat{Y}_{t,b}$ is an expected signal for a given branch b, Y is a processed received signal, $f_{i,b}$ is a coefficient of a signal-dependent noise-whitening filter for the given branch b, L is a number of coefficients of the signal-dependent noise-whitening filter, and $\sigma^2$ is a variance of noise.

* * * * *